United States Patent
Kumagai et al.

(10) Patent No.: US 7,129,147 B2
(45) Date of Patent: Oct. 31, 2006

(54) DELIVERY POSITION ALIGNING METHOD FOR USE IN A TRANSFER SYSTEM AND A PROCESSING SYSTEM EMPLOYING THE METHOD

(75) Inventors: Motohiro Kumagai, Kofu (JP); Keisuke Kondoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/138,421

(22) Filed: May 27, 2005

(65) Prior Publication Data
US 2005/0255609 A1 Nov. 17, 2005

Related U.S. Application Data

(63) Continuation-in-part of application No. PCT/JP03/015183, filed on Nov. 27, 2003.

(30) Foreign Application Priority Data
Nov. 27, 2002 (JP) ............... 2002-344693

(51) Int. Cl.
*H01L 21/76* (2006.01)
(52) U.S. Cl. .................... 438/401
(58) Field of Classification Search ........ 438/200–207, 438/209–211, 218, 237, 165, 294, 308, 337, 438/353, 378, 401, 410, 5–7, 10–11, 14, 16–18, 438/22–24, 29, 31, 34–36, 128–130, 149, 438/484, 538, 104, 107–114, 118, 121–123, 438/135, 142, 145, 151, 157, 176, 478, 184, 438/193, 195–198
See application file for complete search history.

(56) References Cited

U.S. PATENT DOCUMENTS 5,274,434 A * 12/1993 Morioka et al. ......... 356/237.4
5,661,090 A * 8/1997 Otani .................... 29/827

(Continued)

FOREIGN PATENT DOCUMENTS

JP 11-207668 8/1999

(Continued)

OTHER PUBLICATIONS

Patent Abstracts of Japan, JP 2001-202123, Jul. 27, 2001 (reference previously filed in Japanese language on Nov. 14, 2005).

(Continued)

*Primary Examiner*—Michael Lebentritt
*Assistant Examiner*—Andre' Stevenson
(74) *Attorney, Agent, or Firm*—Oblon, Spivak, McClelland, Maier & Neustadt, P.C.

(57) ABSTRACT

A transfer system has a position aligning device, a mounting device, and a transfer mechanism having two pick. In a delivery position aligning method for use in a transfer system, a set of delivery position coordinates that defines an access point of each pick of the transfer mechanism is temporarily determined. Then, a set of delivery position coordinates of each pick of the transfer mechanism to the position aligning device is fixed, and parts of sets of delivery position coordinates of each pick of the transfer mechanism to devices other than the position aligning device are fixed. A position alignment object is transferred to the position aligning device via a transfer route passing an unfixed set of delivery position coordinates, and an amount of positional displacement thereof is calculated. The unfixed set of delivery position coordinates is corrected based on the amount of positional displacement, and fixed.

8 Claims, 22 Drawing Sheets

U.S. PATENT DOCUMENTS

| | | | |
|---|---|---|---|
| 6,259,525 B1 * | 7/2001 | David ........................ | 356/399 |
| 6,432,744 B1 * | 8/2002 | Amador et al. ............. | 438/108 |
| 6,730,541 B1 * | 5/2004 | Heinen et al. .............. | 438/108 |
| 6,742,980 B1 | 6/2004 | Sasaki | |
| 6,911,377 B1 * | 6/2005 | Nepomuceno et al. ...... | 438/462 |
| 2004/0161877 A1 * | 8/2004 | Nepomuceno et al. ...... | 438/110 |

FOREIGN PATENT DOCUMENTS

JP  2001-202123  7/2001

OTHER PUBLICATIONS

Patent Abstracts of Japan, JP 11-207668, Aug. 3, 1999 (reference previously filed in Japanese language on Nov. 14, 2005).

* cited by examiner

FIG.2B

| | THE FIRST LOAD-LOCK CHAMBER | | | | THE SEOND LOAD-LOCK CHAMBER | | | |
|---|---|---|---|---|---|---|---|---|
| | THE FIRST TRANSFER MECHANISM | | THE SEOND TRANSFER MECHANISM | | THE FIRST TRANSFER MECHANISM | | THE SEOND TRANSFER MECHANISM | |
| | A1 | A2 | B1 | B2 | A1 | A2 | B1 | B2 |
| THE THIRD PROCESS | UNFIXED | UNFIXED | FIXED | FIXED | UNFIXED | UNFIXED | FIXED | UNFIXED |
| PICK | | | | | | | | |

FIG. 3B

| | THE FIRST LOAD-LOCK CHAMBER | | | | THE SEOND LOAD-LOCK CHAMBER | | | |
|---|---|---|---|---|---|---|---|---|
| | THE FIRST TRANSFER MECHANISM | | THE SEOND TRANSFER MECHANISM | | THE FIRST TRANSFER MECHANISM | | THE SEOND TRANSFER MECHANISM | |
| PICK | A1 | A2 | B1 | B2 | A1 | A2 | B1 | B2 |
| THE THIRD PROCESS | UNFIXED | UNFIXED | FIXED | FIXED | UNFIXED | UNFIXED | FIXED | UNFIXED |
| THE FIFTH PROCESS | UNFIXED | CORRECTED | ✕ | ✕ | UNFIXED | UNFIXED | ✕ | UNFIXED |

FIG. 4B

| | THE FIRST LOAD-LOCK CHAMBER | | | | THE SEOND LOAD-LOCK CHAMBER | | | |
| | THE FIRST TRANSFER MECHANISM | | THE SEOND TRANSFER MECHANISM | | THE FIRST TRANSFER MECHANISM | | THE SEOND TRANSFER MECHANISM | |
| PICK | A1 | A2 | B1 | B2 | A1 | A2 | B1 | B2 |
|---|---|---|---|---|---|---|---|---|
| THE THIRD PROCESS | UNFIXED | UNFIXED | FIXED | FIXED | UNFIXED | UNFIXED | FIXED | UNFIXED |
| THE FIFTH PROCESS | UNFIXED | CORRECTED | | | UNFIXED | UNFIXED | | UNFIXED |
| THE SEVENTH PROCESS | CORRECTED | | | | UNFIXED | UNFIXED | | UNFIXED |

FIG.5B

| PICK | THE FIRST LOAD-LOCK CHAMBER ||||  THE SECOND LOAD-LOCK CHAMBER ||||
| | THE FIRST TRANSFER MECHANISM || THE SECOND TRANSFER MECHANISM || THE FIRST TRANSFER MECHANISM || THE SECOND TRANSFER MECHANISM ||
| | A1 | A2 | B1 | B2 | A1 | A2 | B1 | B2 |
| --- | --- | --- | --- | --- | --- | --- | --- | --- |
| THE THIRD PROCESS | UNFIXED | UNFIXED | FIXED | FIXED | ✕ | ✕ | ✕ | ✕ |
| THE FIFTH PROCESS | UNFIXED | CORRECTED | ✕ | ✕ | UNFIXED | UNFIXED | ✕ | ✕ |
| THE SEVENTH PROCESS | CORRECTED | ✕ | ✕ | ✕ | UNFIXED | UNFIXED | FIXED | ✕ |
| THE TENTH PROCESS | ✕ | ✕ | ✕ | ✕ | UNFIXED | CORRECTED | ✕ | ✕ |

FIG.6B

| PICK | THE FIRST LOAD-LOCK CHAMBER | | | | THE SEOND LOAD-LOCK CHAMBER | | | |
|---|---|---|---|---|---|---|---|---|
| | THE FIRST TRANSFER MECHANISM | | THE SEOND TRANSFER MECHANISM | | THE FIRST TRANSFER MECHANISM | | THE SEOND TRANSFER MECHANISM | |
| | A1 | A2 | B1 | B2 | A1 | A2 | B1 | B2 |
| THE THIRD PROCESS | UNFIXED | UNFIXED | FIXED | FIXED | UNFIXED | UNFIXED | FIXED | UNFIXED |
| THE FIFTH PROCESS | UNFIXED | CORRECTED | | | UNFIXED | UNFIXED | | UNFIXED |
| THE SEVENTH PROCESS | CORRECTED | | | | UNFIXED | UNFIXED | | UNFIXED |
| THE TENTH PROCESS | | | | | UNFIXED | CORRECTED | | UNFIXED |
| THE TWELFTH PROCESS | | | | | CORRECTED | | | UNFIXED |

FIG.7B

| PICK | THE FIRST LOAD-LOCK CHAMBER ||||  THE SEOND LOAD-LOCK CHAMBER ||||
| | THE FIRST TRANSFER MECHANISM || THE SEOND TRANSFER MECHANISM || THE FIRST TRANSFER MECHANISM || THE SEOND TRANSFER MECHANISM ||
| | A1 | A2 | B1 | B2 | A1 | A2 | B1 | B2 |
|---|---|---|---|---|---|---|---|---|
| THE THIRD PROCESS | UNFIXED | UNFIXED | FIXED | FIXED | UNFIXED | UNFIXED | FIXED | UNFIXED |
| THE FIFTH PROCESS | UNFIXED | CORRECTED | | | UNFIXED | UNFIXED | | UNFIXED |
| THE SEVENTH PROCESS | CORRECTED | | | | UNFIXED | UNFIXED | | UNFIXED |
| THE TENTH PROCESS | | | | | UNFIXED | CORRECTED | | UNFIXED |
| THE TWELFTH PROCESS | | | | | CORRECTED | | | UNFIXED |
| THE FIFTEENTH PROCESS | | | | | | | | CORRECTED |

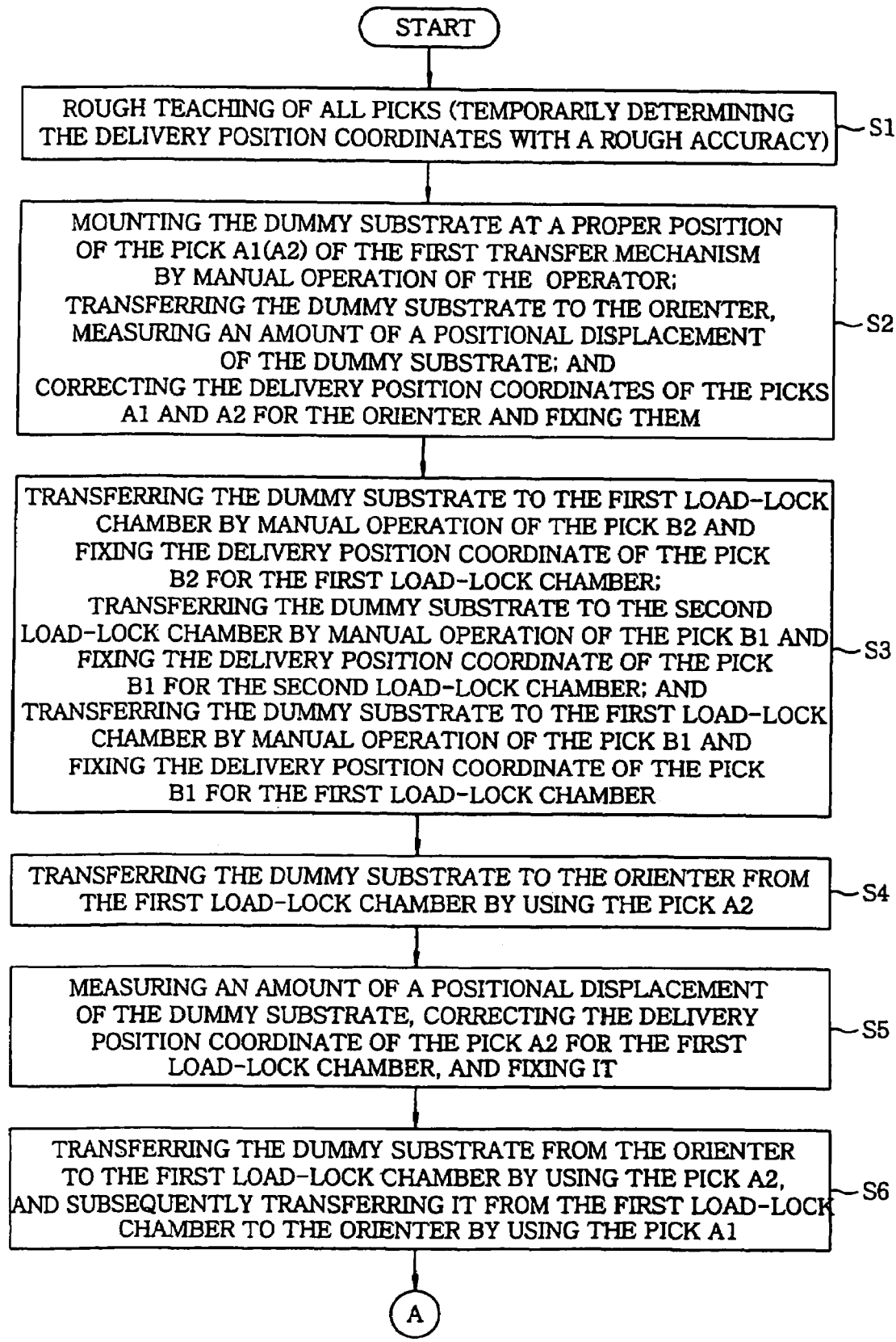

FIG.11A

|  | THE FIRST LOAD-LOCK CHAMBER ||||| THE SEOND LOAD-LOCK CHAMBER ||||
|  | THE FIRST TRANSFER MECHANISM || THE SEOND TRANSFER MECHANISM || THE FIRST TRANSFER MECHANISM || THE SEOND TRANSFER MECHANISM ||
| PICK | A1 | A2 | B1 | B2 | A1 | A2 | B1 | B2 |
| PROCESS A1 | UNFIXED | UNFIXED | FIXED | FIXED | FIXED | UNFIXED | UNFIXED | UNFIXED |
| PROCESS A2 | UNFIXED | CORRECTED |  |  |  | UNFIXED | UNFIXED | UNFIXED |
| PROCESS A3 | CORRECTED |  |  |  |  | UNFIXED | UNFIXED | UNFIXED |
| PROCESS A4 |  |  |  |  |  | CORRECTED | UNFIXED | UNFIXED |
| PROCESS A5 |  |  |  |  |  |  | CORRECTED | UNFIXED |
| PROCESS A6 |  |  |  |  |  |  |  | CORRECTED |

*FIG.11B*

| | THE FIRST LOAD-LOCK CHAMBER | | | THE SEOND LOAD-LOCK CHAMBER | | |
|---|---|---|---|---|---|---|
| | THE FIRST TRANSFER MECHANISM | THE SEOND TRANSFER MECHANISM | | THE FIRST TRANSFER MECHANISM | THE SEOND TRANSFER MECHANISM | |
| | A1 | B1 | B2 | A1 | B1 | B2 |
| PICK | FIXED | UNFIXED | UNFIXED | UNFIXED | FIXED | FIXED |
| PROCESS B1 | | UNFIXED | UNFIXED | CORRECTED | | |
| PROCESS B2 | | CORRECTED | UNFIXED | | | |
| PROCESS B3 | | | CORRECTED | | | |
| PROCESS B4 | | | | | | |

FIG.11C

| PICK | THE FIRST LOAD-LOCK CHAMBER ||| THE SEOND LOAD-LOCK CHAMBER |||
|---|---|---|---|---|---|---|
| | THE FIRST TRANSFER MECHANISM || THE SEOND TRANSFER MECHANISM | THE FIRST TRANSFER MECHANISM || THE SEOND TRANSFER MECHANISM |
| | A1 | A2 | B1 | A1 | A2 | B1 |
| PROCESS C1 | UNFIXED | UNFIXED | FIXED | FIXED | UNFIXED | UNFIXED |
| PROCESS C2 | UNFIXED | CORRECTED | | | UNFIXED | UNFIXED |
| PROCESS C3 | CORRECTED | | | | UNFIXED | UNFIXED |
| PROCESS C4 | | | | | UNFIXED | CORRECTED |
| PROCESS C5 | | | | | CORRECTED | |

FIG. 11D

| | THE FIRST LOAD-LOCK CHAMBER | | THE SEOND LOAD-LOCK CHAMBER | |
|---|---|---|---|---|
| | THE FIRST TRANSFER MECHANISM | THE SEOND TRANSFER MECHANISM | THE FIRST TRANSFER MECHANISM | THE SEOND TRANSFER MECHANISM |
| PICK | A1 | B1 | A1 | B1 |
| PROCESS D1 | FIXED | UNFIXED | FIXED | UNFIXED |
| PROCESS D2 | | CORRECTED | | UNFIXED |
| PROCESS D3 | | | | CORRECTED |

DELIVERY POSITION ALIGNING METHOD FOR USE IN A TRANSFER SYSTEM AND A PROCESSING SYSTEM EMPLOYING THE METHOD

This application is a Continuation-In-Part Application of PCT International Application No. PCT/JP03/015183 filed on Nov. 27, 2003, which designated the United States.

FIELD OF THE INVENTION

The present invention relates to a position aligning method for use in a transfer system for transferring an object to be processed, e.g., a semiconductor wafer, and a processing system employing the method.

BACKGROUND OF THE INVENTION

In general, various processings, such as film formation, etching, oxidation, diffusion and the like, are performed on a semiconductor wafer to manufacture a semiconductor integrated circuit. Along with a recent trend of miniaturation and high integration of a semiconductor integrated circuit, there has been a strong demand for improvements of throughput and yield. For meeting such a demand, a so-called clusterized processing system has been disclosed in Japanese Patent Laid-open Application No. 2000-208589, wherein plural processing apparatus for performing an identical processing or different processings are coupled to each other through a common transfer chamber, and thus, different processings may be continuously performed on a wafer while the wafer is not exposed to the air.

In such a processing system, the wafer is handled as follows. First, the wafer is transferred by a first transfer mechanism from a cassette container installed in an inlet port, which is provided at a front end of the processing system, to be loaded into an inlet side transfer chamber of the processing system. After the wafer is position-aligned by using a position-aligning mechanism, it is loaded into a load-lock chamber that can be vacuum-exhausted. Subsequently, the wafer is loaded by using a second transfer mechanism into a common transfer chamber under a vacuum atmosphere, to which plural vacuum processing apparatus are connected. The wafer is sequentially introduced into the respective vacuum processing apparatus by using the common transfer chamber as a center, and thus, being continuously processed. A processed wafer is transferred along a same route as in the loading, but in a reversed order, to thereby be accommodated in the original cassette container. Such a processing system has therein a single or plural transfer mechanism(s); and an exchange or a transfer of the wafer is performed in an automated manner by using the transfer mechanism(s).

Such a transfer mechanism has one or two pick(s) capable of freely contracting and extending, revolving and elevating. The wafer is directly supported by the pick to be moved in the horizontal direction, so that it is transferred to a predetermined position. While the transfer mechanism is operated, the pick and the wafer kept therein should be prevented from being interfered by or from colliding with other members. Moreover, the pick needs to properly unload the wafer placed on a specified place to transfer same to a destination, and to perform an exchange of the wafer at the destination with high accuracy, e.g., positional accuracy within ±0.20 mm.

For the same reason, in case when an assembling or a large device remodeling is performed, a so-called 'teaching operation' has been performed, wherein an important place, e.g., a place where an exchange of the wafer W is performed at a moving route of the pick of the transfer mechanism, is stored as a set of delivery position coordinates in a controller formed of a computer or the like, which controls an operation of the transfer mechanism. The teaching is performed on each pick for all access points thereof (e.g., access points of the pick to the cassette container, the mounting table of the load-lock chamber, a position-aligning device and a susceptor of each vacuum processing apparatus); and sets of delivery position coordinates defining these access points are stored in the controller. Further, a driving unit of a transfer device has therein an incorder for specifying a pick position. The driving unit has a pulse motor as a driving source; and the number of pulses applied to the pulse motor is controlled based on a detection result of the incorder to control the pick position precisely.

A teaching method of a transfer system in a clusterized processing system has been disclosed in Japanese Patent Laid-open Application No. 2000-127069. When performing the teaching, there is employed a dummy substrate made of a transparent plate having substantially identical diameter and thickness to a semiconductor wafer to be transferred. On the dummy substrate, an outline of the pick is marked at a position where the pick will support the dummy substrate. If the marking coincides with the outline of the pick, the dummy substrate is considered to be kept at a proper position on the pick.

The teaching is performed by following a sequence as explained below. First, a set of delivery position coordinates is temporarily determined in advance with 'rough accuracy' before the teaching is performed with high accuracy. The term used herein 'rough accuracy' refers to an accuracy, wherein the wafer is made sure not to collide with members, e.g., an inner wall of the chamber and the like, even while it is automatically transferred based on this temporarily determined set of delivery position coordinates; and it may contain an error, e.g., about ±2 mm, for a finally fixed set of delivery position coordinates. Subsequently, the dummy substrate is mounted at a very accurately determined proper position by being manually position-aligned at a delivery position on a mounting table in the load-lock chamber, on a susceptor of the vacuum processing chamber or the like. Further, the dummy substrate is unloaded by the pick to be transferred to an orienter as a positioning mechanism, which detects a positional displacement. The temporarily determined a set of delivery position coordinates is corrected based on the positional displacement detected, and the corrected set of delivery position coordinates is stored in the controller as a fixed set of delivery position coordinates. The aforementioned teaching operation is performed on each pick for all access points thereof.

In the teaching method as mentioned above, a position alignment should be performed carefully on all access places to each pick by an operator with the naked eye by using a manual. For the same reason, there are problems that the teaching needs to be performed for a long time, thereby burdening the operator.

Further, in case where the wafer unloaded from the cassette is transferred to the susceptor of the processing device, a position of the wafer to be mounted on the susceptor may be slightly shifted for each transfer route through which the wafer passes, since a manual position alignment is carried out for each pick on a place where the pick accesses.

SUMMARY OF THE INVENTION

It is, therefore, an object of the present invention to provide a position aligning method for use in a transfer system and a processing system employing the method capable of reducing a load on an operator by cutting a number of operation for a manual position alignment, and thus, performing a teaching quickly; and mounting an object to be transferred with a high accuracy at an identical position of a final transfer destination regardless of a transfer route through which the object passes.

In accordance with one aspect of the present invention, there is provided a delivery position aligning method for use in a transfer system, wherein the transfer system is provided with: a first transfer mechanism having at least one pick for supporting an object to be transferred; a second transfer mechanism having at least one pick for supporting the object; plural devices which can be accessed by at least one of the first and the second transfer mechanism, wherein the object is transferred between the devices and a pick of a transfer mechanism gaining access thereto; a position aligning device as one of the plural devices, wherein the position aligning device can be accessed by the first transfer mechanism and detects an amount of positional displacement of a central position of the object mounted thereon; a first relay unit as one of the plural devices, wherein the first relay unit can be accessed by the first and the second transfer mechanism and temporarily supports the object while being transferred between the first and the second transfer mechanism; and a second relay unit as one of the plural devices, wherein the second relay unit can be accessed by the first and the second transfer mechanism and temporarily supports the object while being transferred between the first and the second transfer mechanism, the method including: a temporarily determining step of temporarily determining with a rough accuracy a set of delivery position coordinates that defines an access point of each pick of each transfer mechanism to each of the plural devices; a first fixing step of fixing a set of delivery position coordinates of each pick of the first transfer mechanism for the position aligning device; a second fixing step of fixing parts of sets of delivery position coordinates of each pick of each transfer mechanism for devices other than the position aligning device; a third fixing step of transferring a position alignment object to the position aligning device via a transfer route passing an unfixed set of delivery position coordinates that has been temporarily determined at the temporarily determining step; calculating an amount of positional displacement of the position alignment object that is supported by the position aligning device; correcting the unfixed set of delivery position coordinates based on the amount of positional displacement of the position alignment object; and fixing the corrected set of delivery position coordinates as a fixed set of delivery position coordinates; and a fourth fixing step of repeatedly performing the third fixing step until all unfixed sets of delivery position coordinates, which have been temporarily determined at the temporarily determining step, are fixed.

As mentioned above, since the sets of delivery position coordinates can be automatically fixed one by one at the third and the fourth step, it is possible to cut a number of operation for a manual operation by an operator. Further, the sets of delivery position coordinates to the second transfer mechanism can be fixed indirectly by using the fixed sets of delivery position coordinates to the first transfer mechanism, even in case where the second transfer mechanism cannot access directly to the position aligning device.

In a typical embodiment, the first and the second transfer mechanism, and the relay units correspond to a transfer mechanism provided in an atmospheric transfer chamber, transfer mechanism provided in a vacuum common transfer chamber, and load-lock chambers provided between the transfer mechanisms, e.g., in a cluster system, respectively.

In a preferred embodiment of the present invention, the transfer route passing the temporarily determined and an unfixed set of delivery position coordinates may contain: a route for transferring the position alignment object from the position aligning device to the first relay unit by using any one pick of the first transfer mechanism; a route for transferring the position alignment object from the first relay unit to the second relay unit by using any one pick of the second transfer mechanism; and a route for transferring the position alignment object from the second relay unit to the position aligning device by using any one pick of the first transfer mechanism.

As described above, since the sets of delivery position coordinates are sequentially fixed based on the results of transferring the object along the routes passing the position aligning device, the first and the second relay unit, each pick of the second transfer mechanism can support at the same position thereon the object disposed on the first or the second relay unit, even in case where the object is transferred to any of the first or the second relay unit by the first transfer mechanism and, further, by using any pick of the first transfer mechanism.

It is preferable that, in the transfer route passing the temporarily determined and unfixed set of delivery position coordinates, only one set of delivery position coordinates among plural sets of delivery position coordinates contained in the transfer route is unfixed and the remaining sets are fixed when attempting to transfer the position alignment object along the transfer route.

In another preferred embodiment of the present invention, the plural devices may contain a processing device for processing an object transferred thereto, the processing device being disposed at a position to which the second transfer mechanism is accessible, and the second transfer mechanism has a first and a second pick, and the delivery position aligning method may further include the steps of: after fixing sets of delivery position coordinates of the two picks of the second transfer mechanism for at least one of the first and the second relay unit and a set of delivery position coordinates of at least one pick of the first transfer mechanism for said at least one of the first and the second relay unit, transferring the position alignment object to the processing device by using the first pick of the second transfer mechanism based on a temporarily determined set of delivery position coordinates of the first pick of the second transfer mechanism for the processing device; unloading from the processing device the position alignment object transferred thereto by using the second pick of the second transfer mechanism based on a temporarily determined set of delivery position coordinates of the second pick for the processing device and, further, transferring it to the position aligning device; obtaining an amount of positional displacement of the position alignment object by using the position aligning device, and correcting the set(s) of delivery position coordinates of any one or both pick(s) of the second transfer mechanism for the processing device based on the obtained amount of positional displacement; and fixing the corrected sets of delivery position coordinates as fixed sets of delivery position coordinates of both picks, in case where the sets of delivery position coordinates of both picks of the second transfer mechanism for the processing device are corrected, or fixing the corrected set of delivery position coordinates of one pick and the temporarily determined set of delivery position coordinates of the other pick as fixed sets of delivery position coordinates of both picks, in case where the set of delivery position coordinates of only said one pick of the second transfer mechanism for the processing device is corrected.

In this case, it is possible to mount the object at the same position of the processing apparatus regardless of the transfer route.

In still another preferred embodiment of the present invention, the transfer system may be further provided with a receiving member for receiving the object and disposed at a position to which the first transfer mechanism is accessible, and the delivery position aligning method may further include the step of fixing a set of delivery position coordinates of each pick of the first transfer mechanism for the position alignment object accommodated in the receiving member.

In this case, it is possible to transport the object accommodated in the receiving member at the same position of destination regardless of the transfer route.

In another aspect of the present invention, there is provided a delivery position aligning method for use in a transfer system, wherein the transfer system is provided with: a position aligning device for detecting an amount of positional displacement of a central position of an object mounted thereon; a mounting device for mounting thereon the object while the object is transferred; and a transfer mechanism having two picks supporting the object, the method including the steps of: temporarily determining with a rough accuracy sets of delivery position coordinates that define access points of each pick of the transfer mechanisms to the position aligning device and the mounting device; fixing a set of delivery position coordinates of each pick of the transfer mechanism for the position aligning device; mounting a position alignment object on a normal position of the mounting device, and transferring the mounted position alignment object to the position aligning device by using a first pick of the transfer mechanism; obtaining an amount of positional displacement of the position alignment object by using the position aligning device, correcting a set of delivery position coordinates of the first pick of the transfer mechanism for the mounting device based on the amount of positional displacement, and fixing the corrected set of delivery position coordinates as a fixed set of delivery position coordinates; transferring the position alignment object mounted on the position aligning device to the mounting device by using one pick of the transfer mechanism; transferring the position alignment object to the position aligning device by using the other pick of the transfer mechanism; and obtaining an amount of positional displacement of the position alignment object by using the position aligning device, correcting a set of delivery position coordinates of the second pick of the transfer mechanism for the mounting device based on the amount of positional displacement, and fixing the corrected set of delivery position coordinates as a fixed set of delivery position coordinates.

In accordance with the aforementioned invention, since the set of delivery position coordinates of one pick to the mounting device is fixed by the position aligning device, and the set of delivery position coordinates of the other pick is fixed by using the fixed set of delivery position coordinates, it is possible to mount the object on the same position of the mounting device even in case of using any pick.

Further, the object may be mounted on the normal position of the mounting device by manual operation or, by transportation using an additional transfer mechanism.

In still another preferred embodiment of the present invention, the steps of fixing the sets of delivery position coordinates of the first and the second pick may be performed by correcting a temporarily determined set of delivery position coordinates of each pick for the mounting device to compensate for a corresponding amount of positional displacement.

In still another aspect of the present invention, there is provided an object processing system in which an object delivery position aligning process is carried out by the aforementioned method.

BRIEF DESCRIPTION OF THE DRAWINGS

The above and other objects and features of the present invention will become apparent from the following description of preferred embodiments given in conjunction with the accompanying drawings, in which:

FIGS. 2A, 3A~7A present schematic diagrams showing transfer routes of an object to be transferred in a first embodiment of the delivery position aligning method (teaching) in accordance with the present invention;

FIGS. 2B, 3B~7B present process tables showing final statuses of sets of position coordinates, in the first embodiment of the delivery position aligning method (teaching) in accordance with the present invention;

FIGS. 9A, 9B and 10 provide flowcharts showing respective processes of the delivery position aligning method in accordance with the present invention;

FIGS. 11A~11D present process tables explaining second through fifth embodiments of the delivery position aligning method in accordance with the present invention.

DETAILED DESCRIPTION OF THE PREFERRED EMBODIMENT

Figure 1:
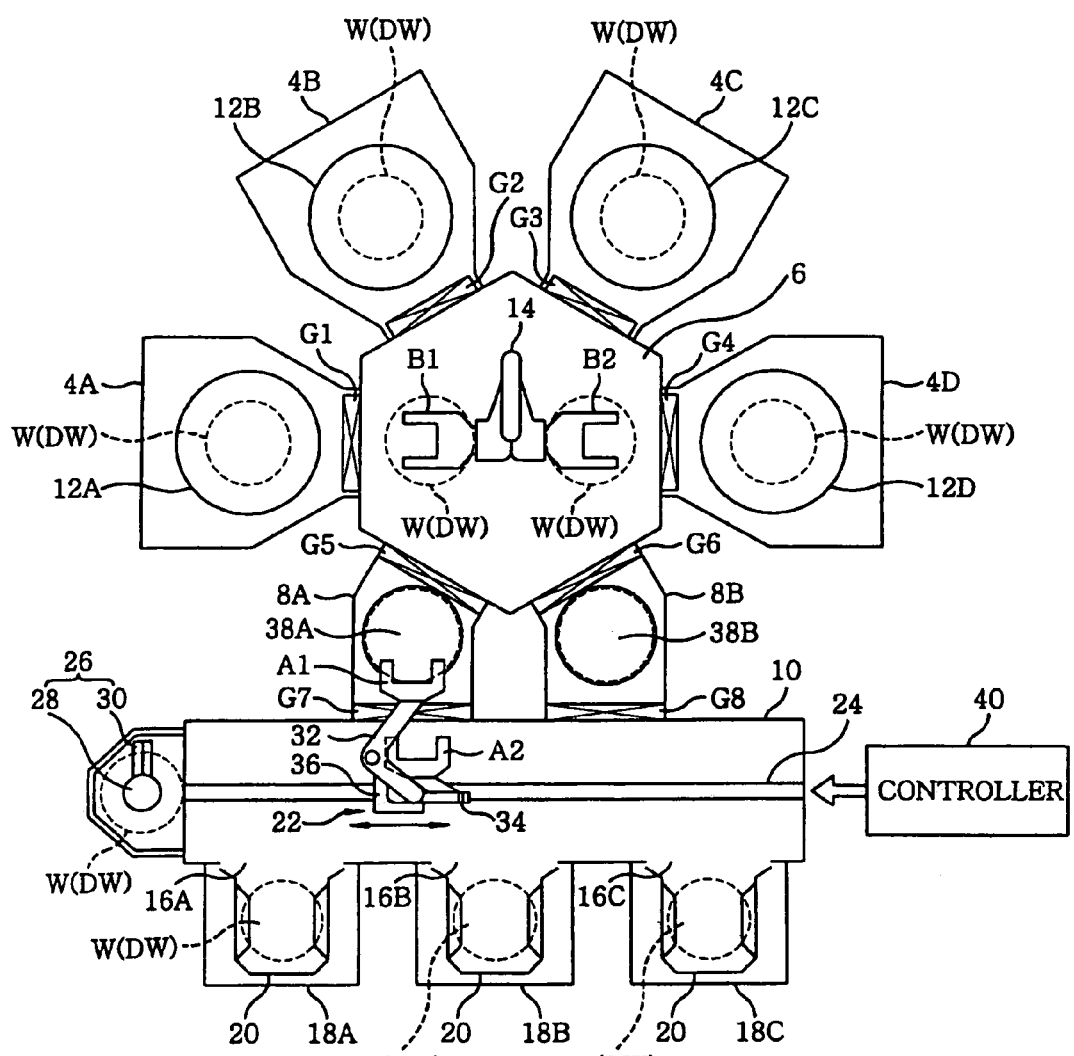
FIG. 1 offers a schematic configuration view showing an exemplary processing system including a transfer system in which a delivery position alignment is performed in accordance with the present invention.

Hereinafter, a preferred embodiment of a delivery position aligning method of a transfer system in accordance with the present invention will be described in detail with reference to the accompanying drawings. FIG. 1 is a schematic configuration view showing an example of a processing system including a transfer system wherein the present method is performed.

First, the processing system will now be discussed. As described in FIG. 1, a processing system (a transfer system) 2 includes plural, e.g., four processing devices 4A, 4B, 4C and 4D in the drawing; an approximately hexagonal shaped common transfer chamber (a second transfer system) 6 kept under a vacuum atmosphere; first and second load-lock chambers 8A and 8B, each having a load-lock function; and a thin and long inlet side transfer chamber (a first transfer chamber) 10 kept under an atmospheric pressure. Four sides of the approximately hexagonal shaped common transfer chamber 6 have contact with the processing devices 4A~4D; and other two sides thereof have contact with one sides of the first and the second load-lock chamber 8A and 8B. The inlet side transfer chamber 10 is connected to the other sides of the first and the second load-lock chamber 8A and 8B.

The processing devices 4A~4D and the first and the second load-lock chamber 8A and 8B, connected to the common transfer chamber 6 through gate valves G1~G6 that can be opened or closed freely, are communicated with the common transfer chamber 6, if the gate valves are opened; or they are airtightly shut off from the common transfer chamber 6, if the gate valves are closed. Gate valves G7 and G8 are installed between the first and the second load-lock chamber 8A and 8B and the inlet side transfer chamber 10, respectively.

The processing devices 4A~4D are configured to perform the same kind or different kinds of process(es) on the semiconductor wafer W, in which susceptors 12A~12D, each capable of mounting thereon the wafer W, are installed, respectively. In the common transfer chamber 6, there is provided a second transfer mechanism 14 having a multi-joint arm capable of contracting, extending and revolving, wherein the second transfer mechanism 14 can access two load-lock chambers 8A and 8B and four respective processing devices 4A~4D. The second transfer mechanism 14 has two picks B1 and B2 that can be moved horizontally and independently in opposite directions to each other by using contraction and extension of the arm, which can handle two wafers simultaneously. Further, the second transfer mechanism 14 may have only a single pick.

The inlet side transfer chamber 10 is formed in a box body having a rectangular cross section whose width is larger than a height as described in FIG. 1. In one long side of the inlet side transfer chamber 10, there are provided one or more, e.g., three transfer ports 16A, 16B and 16C in the drawing, for introducing the wafer W. Inlet ports 18A, 18B and 18C are provided to correspond to the transfer ports 16A~16C, respectively, wherein each of the respective inlet ports 18A, 18B and 18C can mount one cassette container 20. In the cassette container 20, plural, e.g., twenty-five wafers W, may be mounted at multiple levels separated from each other with an equal pitch.

In the inlet side transfer chamber 10, there is installed a first transfer mechanism 22 as an inlet side transfer mechanism for transferring the wafer W along a length direction of the transfer chamber 10. The first transfer mechanism 22 can slide on a guide rail 24, which extends in the length direction of the transfer chamber 10 in a central portion inside the inlet side transfer chamber 10. The guide rail 24 has therein an incorder-attached linear motor as a moving mechanism; and the first transfer mechanism 22 moves along the guide rail 24 by operating the linear motor.

At one end of the inlet side transfer chamber 10 in the length direction thereof, there is installed an orienter 26 as a position aligning device for performing a position alignment of the wafer. Further, in the middle of the inlet side transfer chamber 10 in the length direction thereof, there are provided the aforementioned two load-lock chambers 8A and 8B through the gate valves G7 and G8. The orienter 26 has a rotatable table 28, which is rotated by using a driving motor (not shown) while the wafer W is mounted thereon. At an outer periphery of the rotatable table 28, there is provided an optical sensor 30 for detecting a periphery of the wafer W, and thus, a position of a positioning reference mark of the wafer W, e.g., a position of a notch or an orientation flat, and an amount of positional displacement of a center of the wafer W from that of the rotatable table 28 can be detected.

The first transfer mechanism 22 has two multi-joint arms 32 and 34 disposed in two stairs, an upper and a lower stair. To leading ends of the respective multi-joint arms 32 and 34, there are attached two fork shaped picks A1 and A2, on which the wafer W can be supported directly. The respective transfer arms 32 and 34 are capable of contracting and extending radially by using a rotation axis as a center. Further, contracting and extending operations of the transfer arms 32 and 34 may be independently controlled. The rotation axes of the transfer arms 32 and 34 are coaxially connected to a base 36 to be rotated with respect thereto, and thus, the transfer arms 32 and 34 can be rotated as a unit with respect to the base 36. Further, the first transfer mechanism 22 may have only a single pick.

Still further, in the first and the second load-lock chamber 8A and 8B, there are installed mounting tables 38A and 38B for temporarily mounting thereon the wafer W, respectively. At the respective mounting tables 38A and 38B, there are installed elevatable lift pins (not shown) for receiving the wafer from the transfer arms 32 and 34 and delivering same thereto. Control of all operations of the processing system 2, e.g., operations of the transfer mechanisms 14 and 22 and the orienter 26 and the like, is carried out by a controller 40 formed of a microcomputer or the like.

In the following, a first embodiment of a delivery position aligning method (teaching) performed on the processing system 2 described in FIG. 1, which has been explained before, will be discussed.

In the present embodiment, a delivery position alignment for all possible transfer routes, which can be taken between the common transfer chamber 6 and the orienter 26, is performed before a delivery position alignment of the second transfer mechanism 14 for any of the respective susceptors 12A~12D of the processing devices 4A~4D is carried out. Accordingly, the wafer can be mounted very accurately on a same position on each of the susceptors 12A~12D regardless of the transfer route to be taken. Further, in the present specification, in case where an object is transferred from a specified place (e.g., the first load-lock chamber 8A) to another place (e.g., the processing device 4A) by using the transfer mechanism 14 or 22 (e.g., the second transfer mechanism 14), "transfer routes" for transportations performed by using different picks (e.g., picks B1 and B2) are considered to be different from each other, even for the case the transportation routes start from a same starting position and end at a same ending position.

Figure 9B:
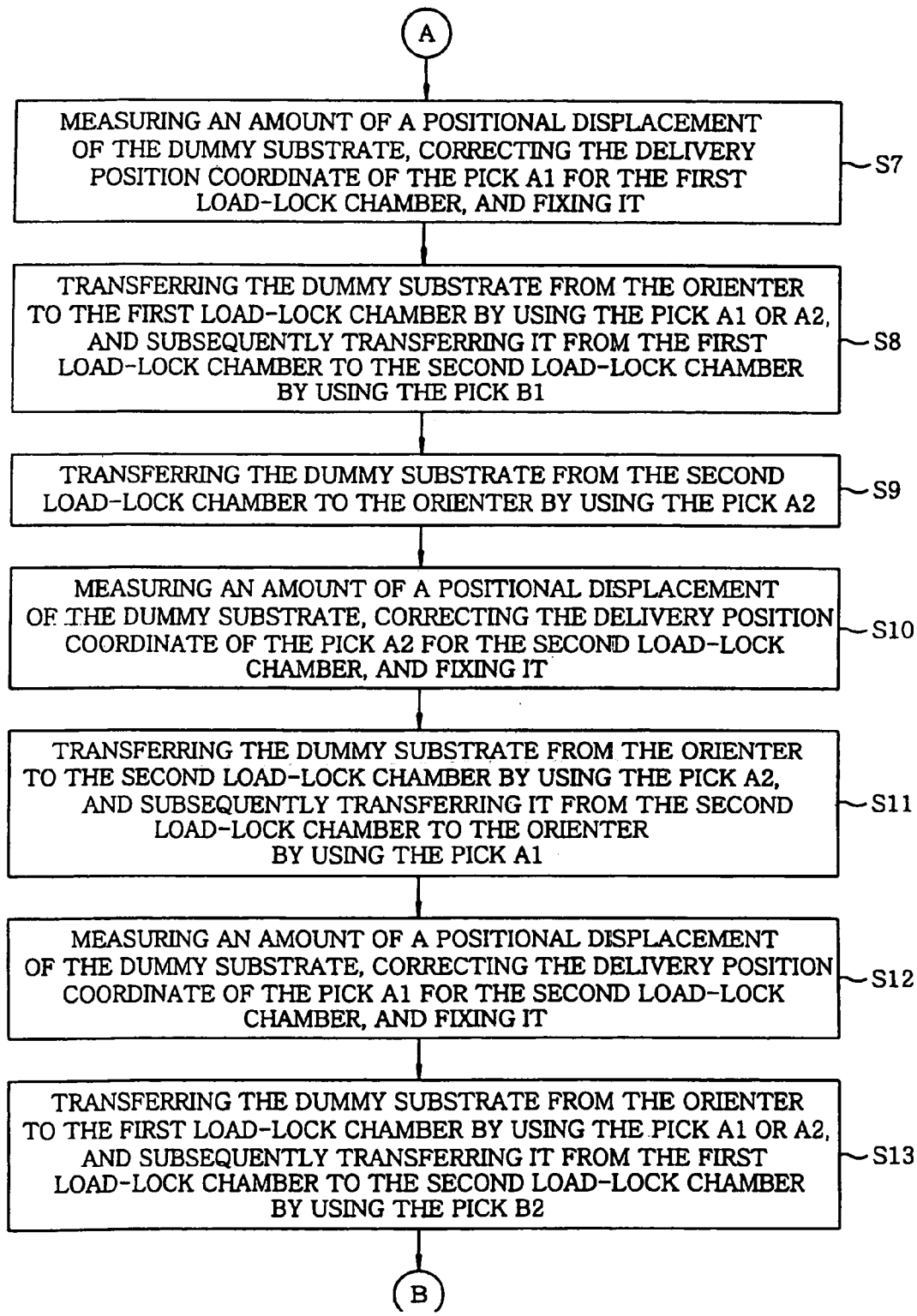
Figure 10:
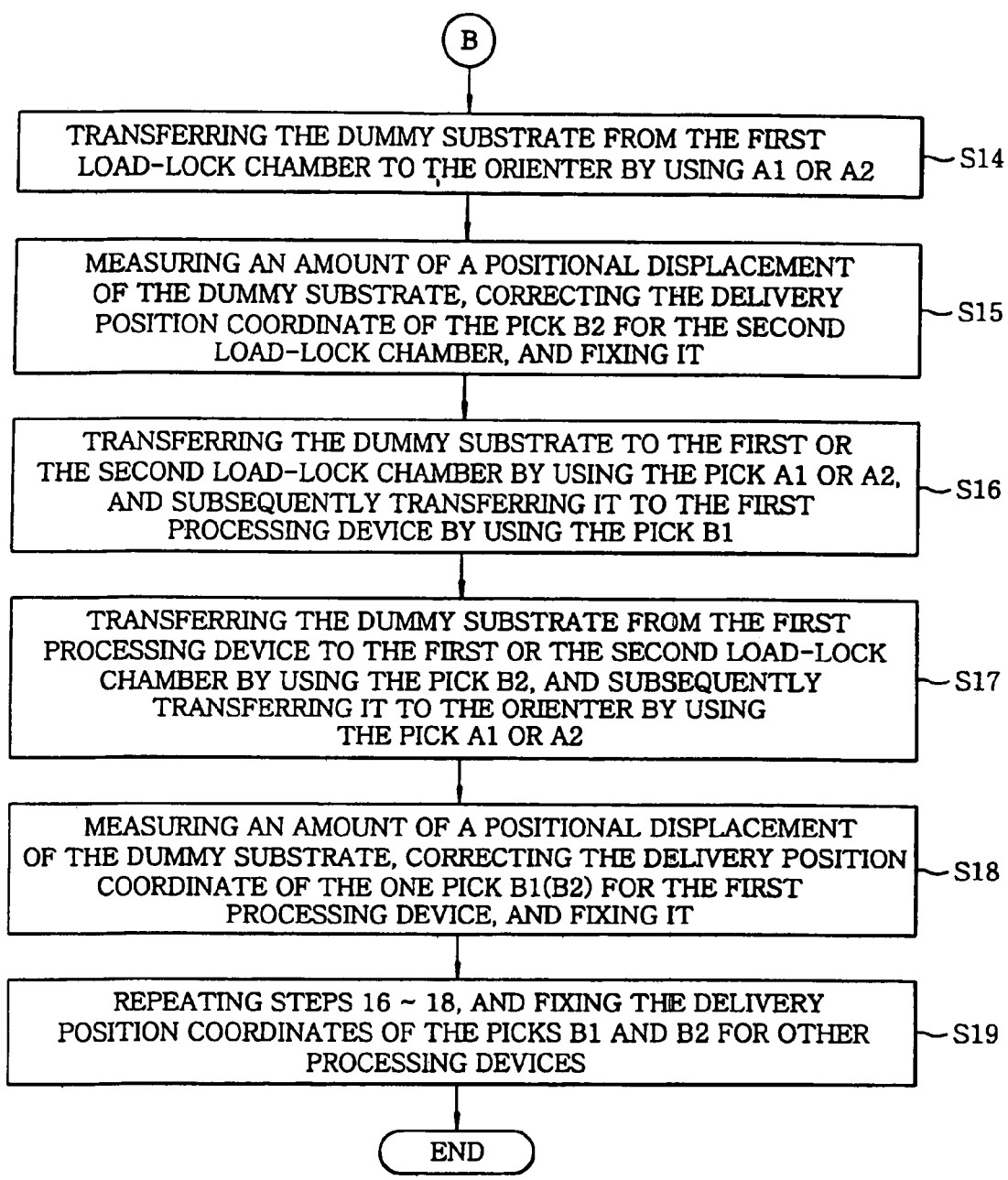

FIGS. 2A, 3A~7A and 8 present schematic views showing transfer routes of a dummy substrate for delivery position alignment in the delivery position aligning method in accordance with the present invention. Further, FIGS. 2B, 3B~7B describe final statuses of sets of delivery position coordinates of the respective load-lock chamber for each pick. FIGS. 9A, 9B and 10 are flowcharts explaining respective processes of the delivery position aligning method in accordance with the present invention.

A dummy substrate for position alignment, which is employed for the delivery position aligning method, is made of a transparent plate having an identical diameter and a substantially same thickness to those of an object to be processed (an object to be transferred). On a surface of the dummy substrate, there is indicated a mark, e.g., an outline of the pick, at a place where the pick will be positioned, in case where the dummy substrate is supported by the pick at a proper position. In case when keeping the dummy substrate at a proper position on the pick, the operator allows the wafer to be mounted on the pick by a manual operation while confirming with the naked eye that the mark coincides with the outline of the pick.

First, at a first process, a rough teaching is performed on all picks of the processing system 2, i.e., both picks A1 and A2 of the first transfer mechanism 22 and both picks B1 and B2 of the second transfer mechanism 14. Namely, rough sets of delivery position coordinates of respective picks are temporarily determined (S1). In this rough teaching, sets of delivery position coordinates, which define access points to all devices to which the respective picks A1, A2, B1 and B2 are accessible, are temporarily determined by properly using combination of an automatic movement and a manual movement of the pick. In case when moving the pick manually, a predetermined number of pulses are applied to the pulse motor of the transfer mechanism to slightly move the pick. The temporarily determined sets of delivery position coordinates are stored in the controller 40 (see FIG. 1). In the rough teaching, it is sufficient that the sets of delivery position coordinates are temporarily determined with 'rough accuracy', as long as the dummy substrate kept on the pick during the transportation is not interfered or collided with members, e.g., an inner wall of each chamber and the like, which are present in the transfer route. Specifically, the sets of delivery position coordinates are temporarily determined with 'rough accuracy', e.g., within about ±2 mm, by the rough teaching. Further, in case where a manufacturing error of the transfer system is trivial, the sets of delivery position coordinates may be temporarily determined by calculation based on a design value of the transfer system without practically moving the pick.

Sets of delivery position coordinates for following access points are temporarily determined at the first process:

Access points of the picks A1 and A2 to the orienter 26;
Respective access points of the picks A1 and A2 to the first and the second load-lock chamber 8A and 8B;
Respective access points of the picks A1 and A2 to the inlet ports 18A~18C;
Respective access points of the picks B1 and B2 to the first and the second load-lock chamber 8A and 8B; and
Respective access points of the picks B1 and B2 to the respective processing devices 4A~4D.

In the following will be described a second process. At the second process, first, dummy substrates DW are supported at proper positions on the respective picks A1 and A2 by using the mark on the dummy substrate DW by a manual operation of an operator. Subsequently, each of the dummy substrates is automatically transferred to the orienter 26 in an automated manner based on the temporarily determined set of delivery position coordinates, to thereby be transported to the rotatable table 28 in an automated manner. (Hereinafter, in the present specification, the term "automatic" or "in the automated manner" means an operation of the transfer device, that is performed by controlling the transfer mechanisms 14 and 22 by the controller 40 based on the sets of delivery position coordinates stored therein at the time of the transportation without a manual operation by the operator, as long as there is no specific supplementary explanation). Next, the rotatable table 28 is rotated while the dummy substrate DW is mounted thereon; an eccentric amount of dummy substrate DW is measured in relation to a rotation angle by using the optical sensor 30; and an amount of positional displacement of the dummy substrate DW is calculated based on the measured result. Based on the calculated amount of positional displacement, the set of delivery position coordinates, that has been temporarily determined for each pick, is corrected to compensate for the amount of positional displacement, and the corrected set of delivery position coordinates is fixed as a final set of delivery position coordinates (S2). The second process is individually performed on both picks A1 and A2, and thus, sets of delivery position coordinates of both picks A1 and A2 for the orienter 26 are fixed. Accordingly, if the dummy substrate DW supported at a proper position on each of the picks A1 and A2 is transferred to the orienter 26 in an automated manner to be mounted thereon automatically, it will be mounted such that the center thereof will coincide with that of the rotatable table 28.

In the following will be described a third process. At the third process, sets of delivery position coordinates of the picks B1 and B2 of the second transfer mechanism 14 for the first and/or the second load-lock chamber (relay unit) 8A and 8B are fixed (S3). In the illustrated embodiment, at the third process, as described in FIG. 2B, a set of delivery position coordinates of the pick B2 for the first load-lock chamber 8A is fixed; sets of delivery position coordinates of the pick B1 for the first and the second load-lock chamber 8A and 8B are fixed; and a set of delivery position coordinates of the pick B2 for the second load-lock chamber 8B remains unfixed. Further, in the tables shown in FIGS. 2B, 3B~7B, the term 'unfixed' indicates a state where the set of delivery position coordinates, which has been temporarily determined at the first process, is left as it is; and the term 'fixed' indicates a state where the set of delivery position coordinates is fixed to thereby be finalized.

Figure 2A:
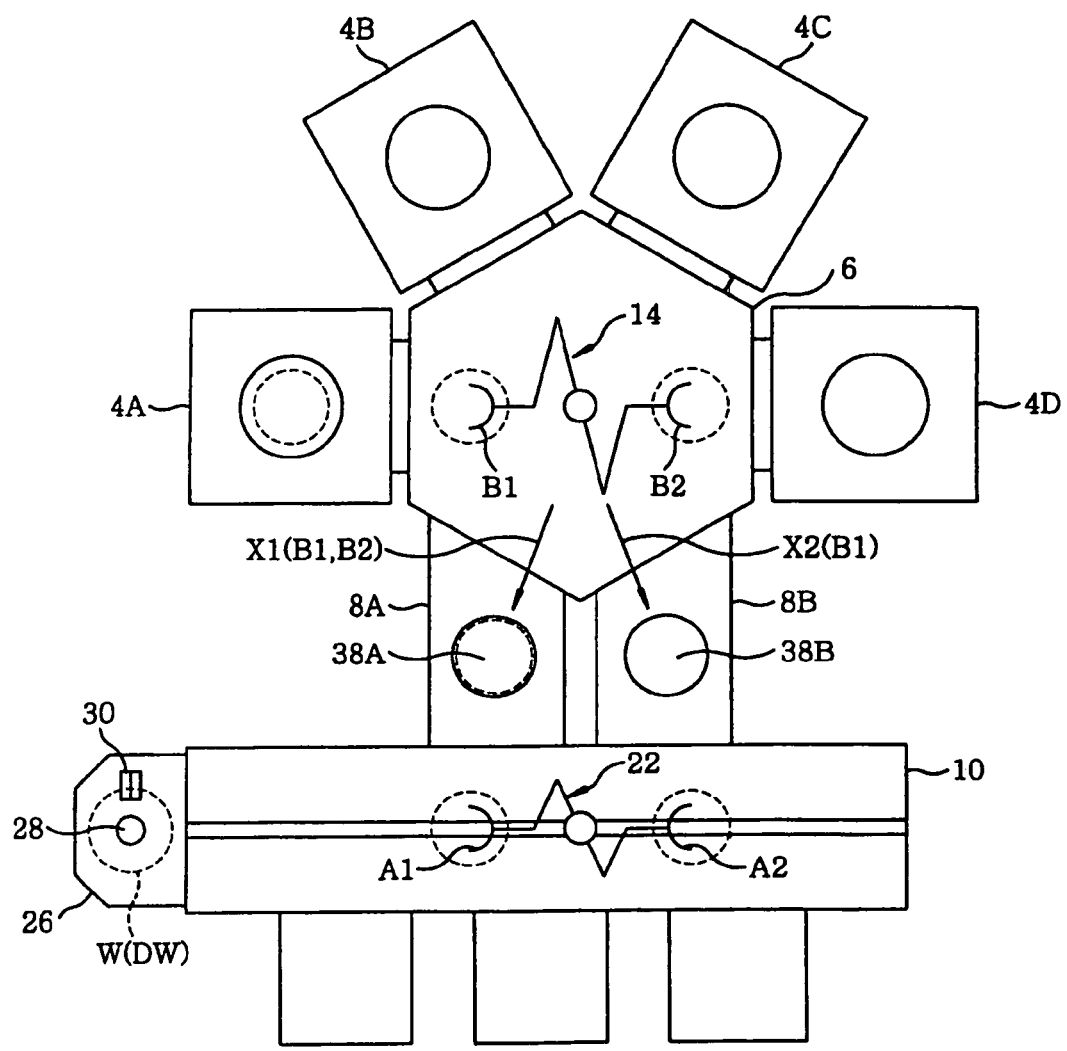
Figure 3A:
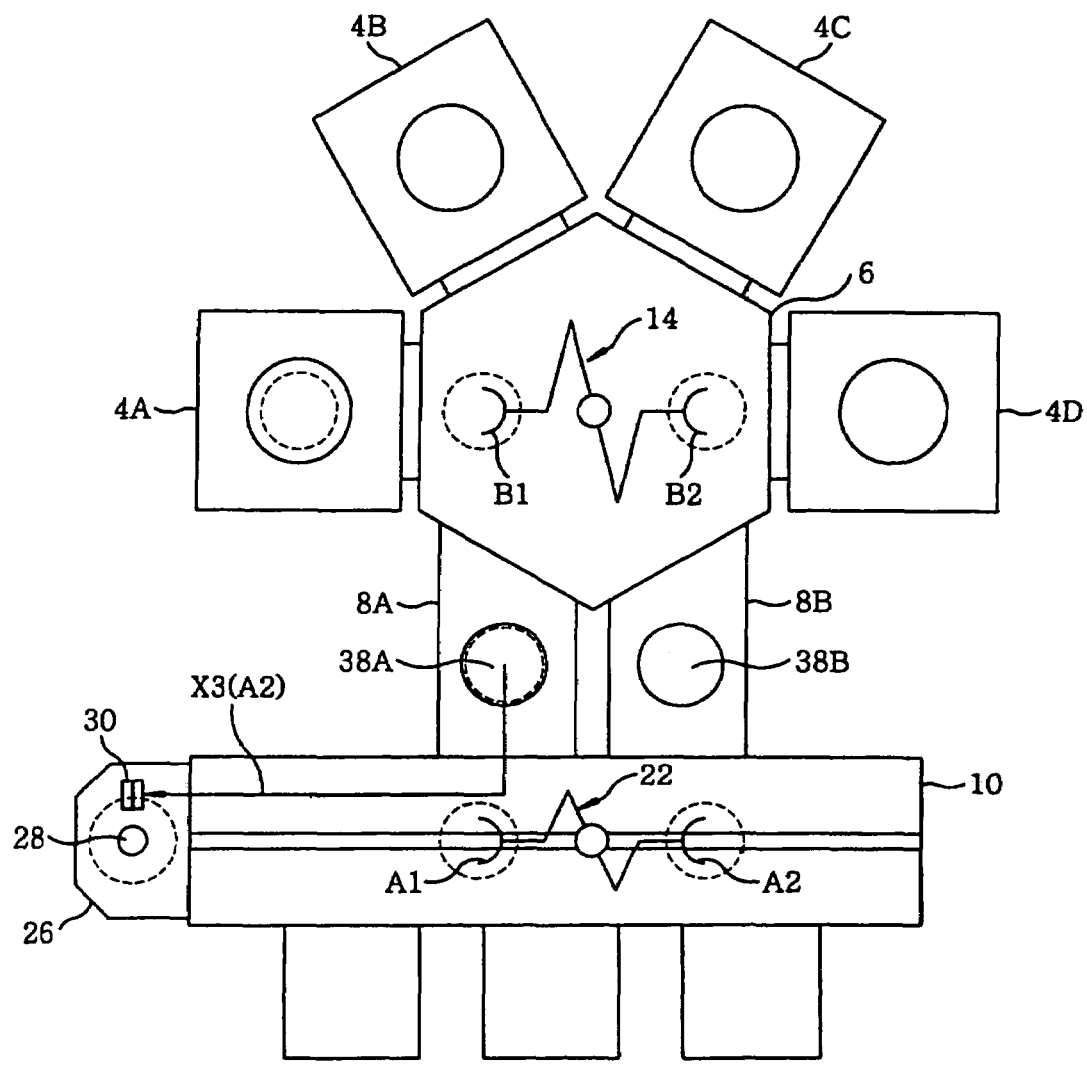
Figure 4A:
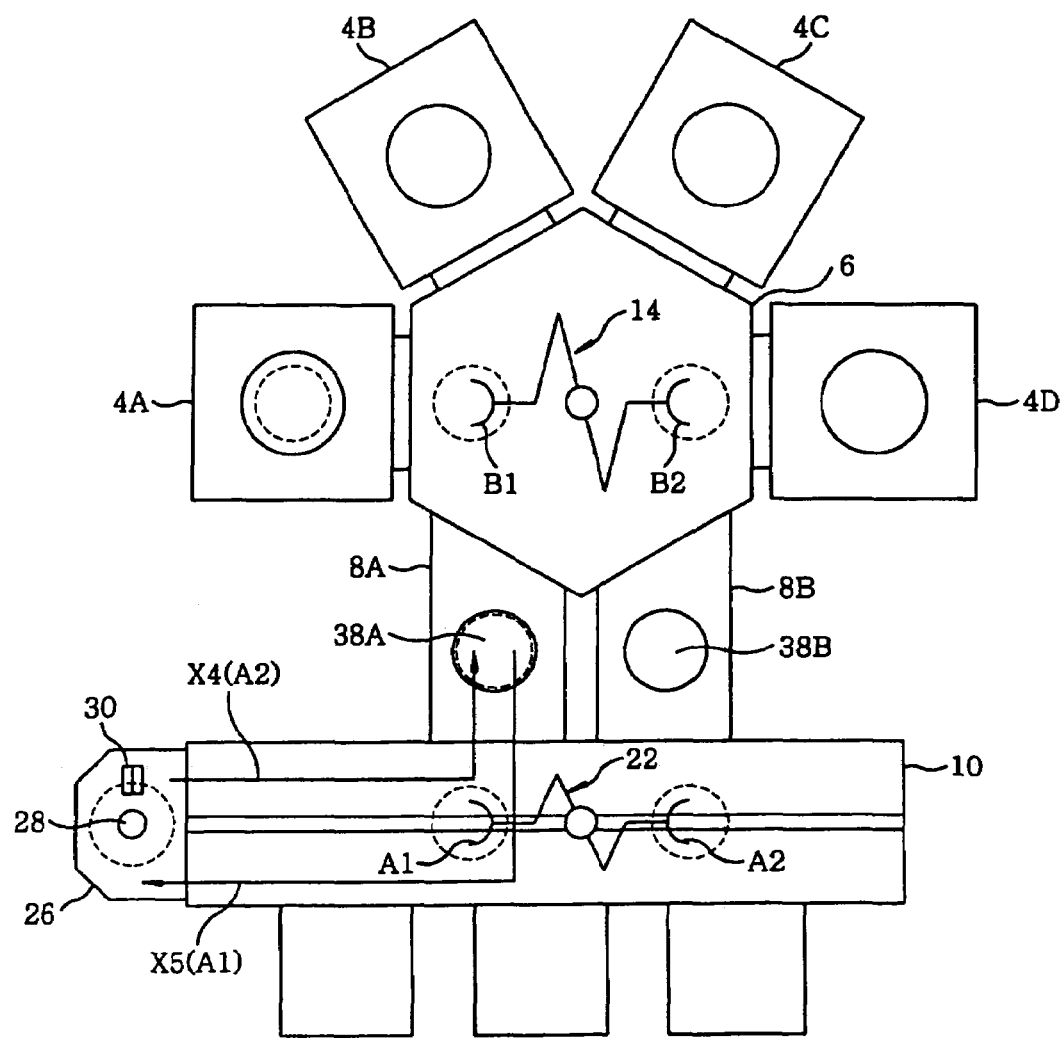
Figure 5A:
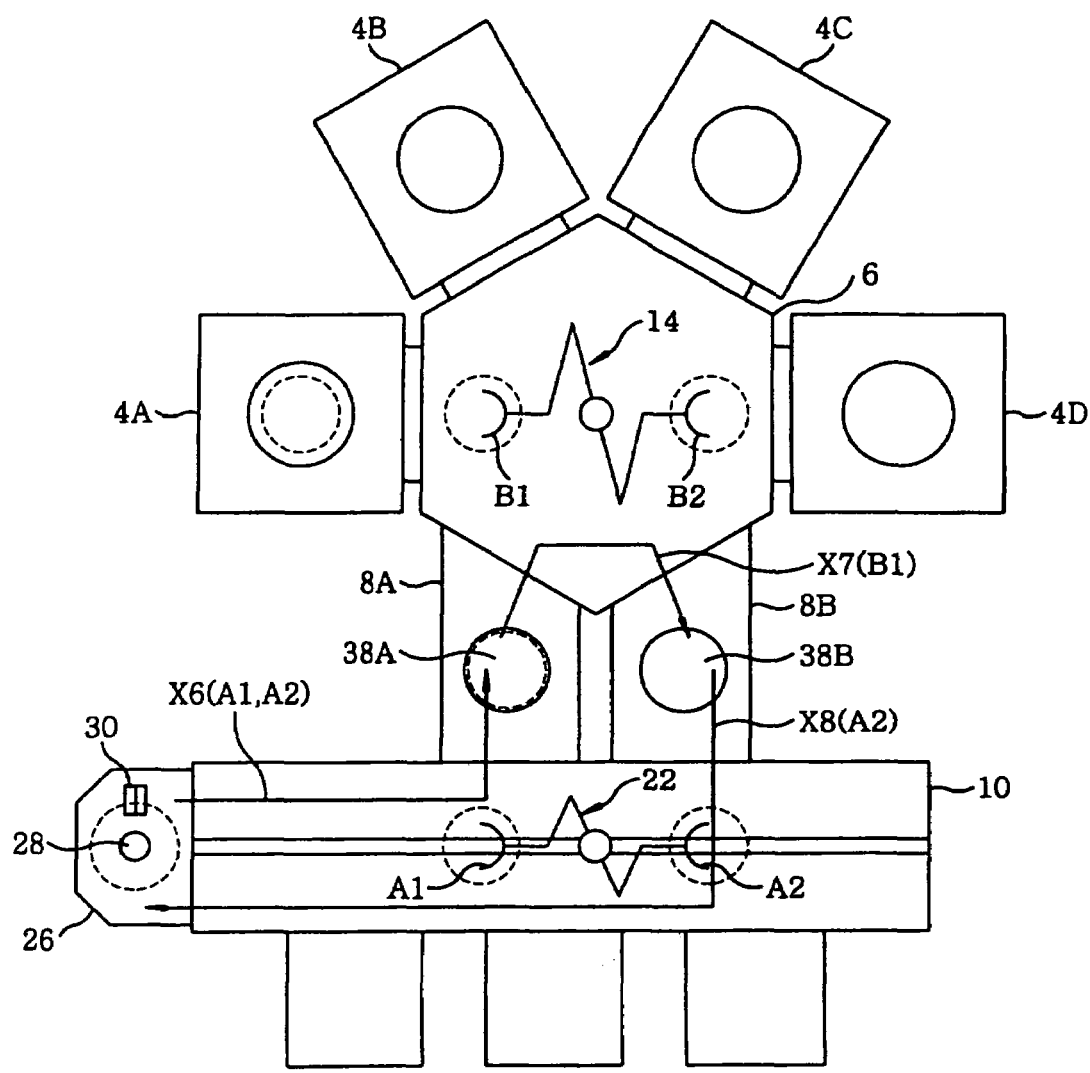
Figure 6A:
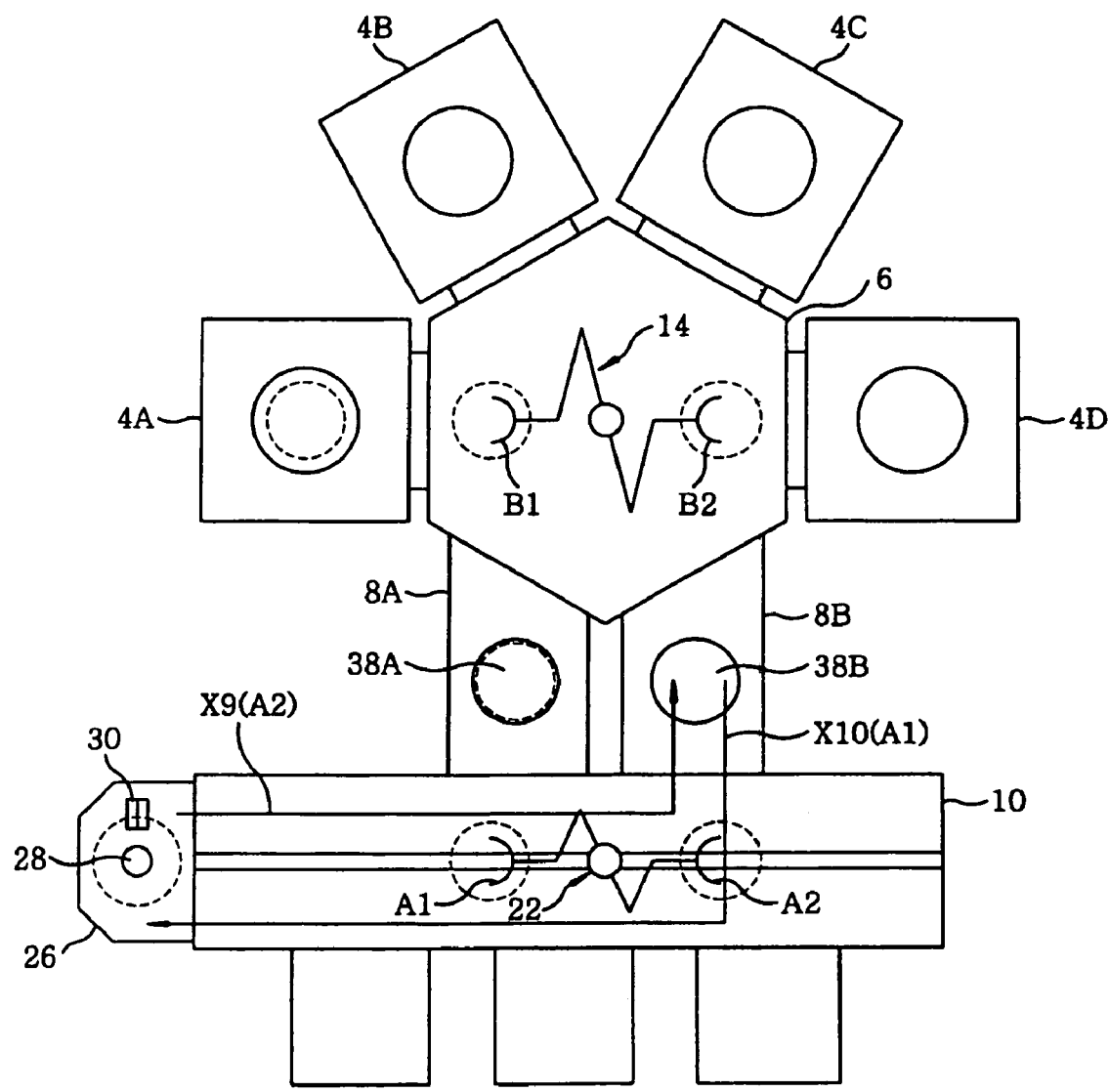
Figure 7A:
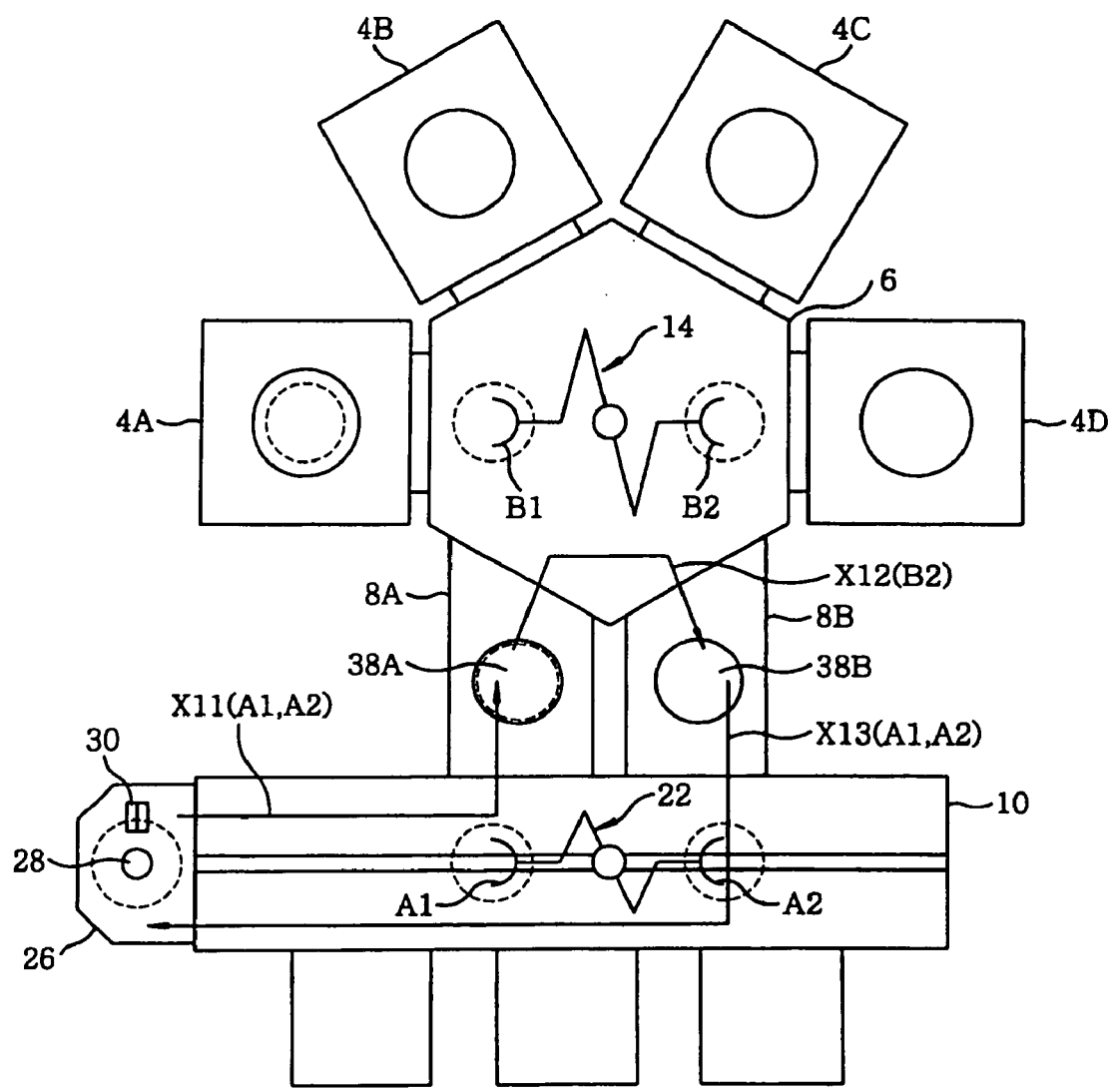
Figure 8:
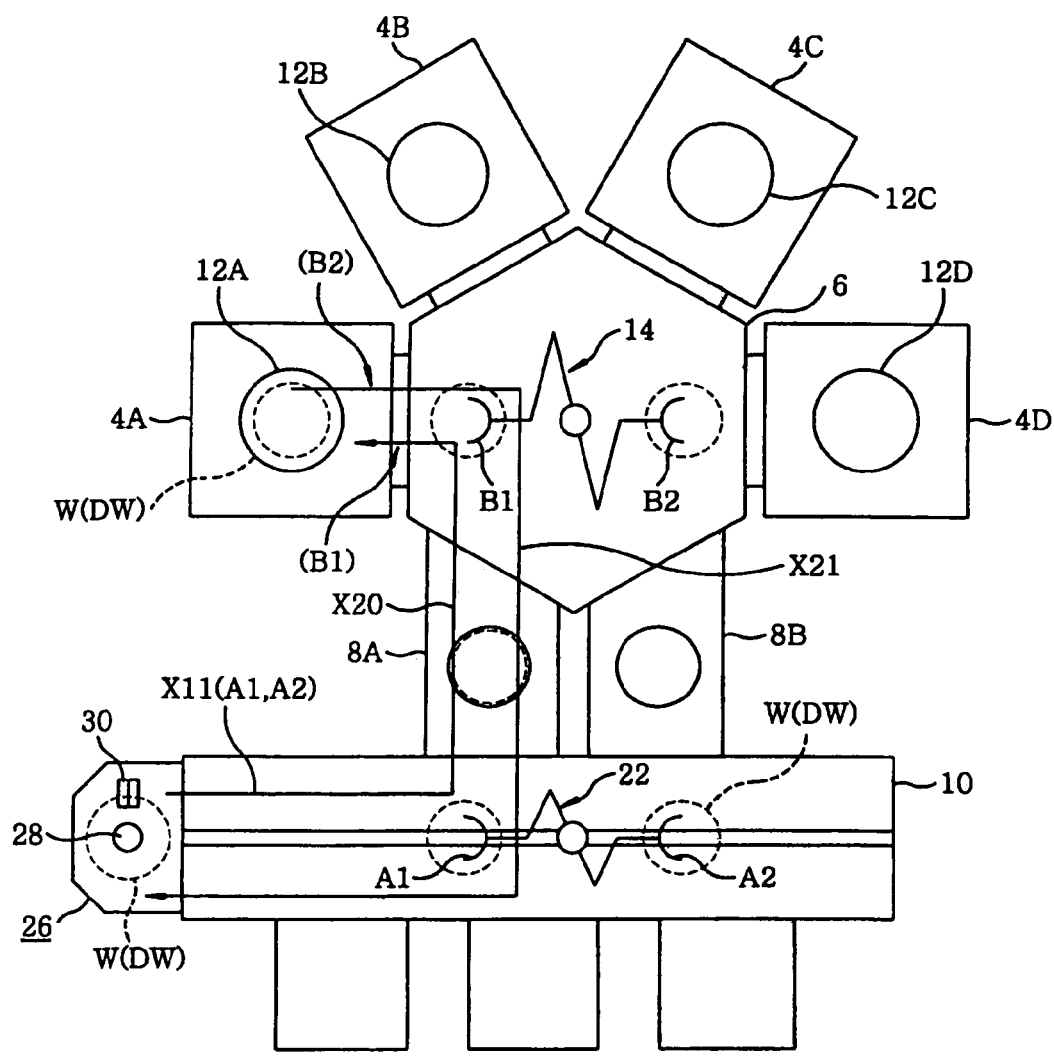
FIG. 8 is a diagram showing a transfer route in the first embodiment of the delivery position aligning method in accordance with the present invention.

First, at the third process, the dummy substrate DW is supported at a proper position of one pick B2 (by a position alignment by the manual operation of the operator by using the mark of the dummy substrate DW); transferred to the mounting table 38A of the first load-lock chamber 8A by a moving operation as indicated by an arrow X1 of FIG. 2A, which is accompanied by a manual control; and mounted on a substantially central position of the mounting table 38A (the delivery position alignment may be performed without mounting it practically). Further, a set of delivery position coordinates corresponding to a mounting position is fixed as a final set of delivery position coordinates. Accordingly, a set of delivery position coordinates of the pick B2 for the mounting table 38A of the first load-lock chamber 8A is fixed. Further, it is sufficient that the set of delivery position coordinates fixed herein has a positional accuracy to such a degree that it will not affect a transfer operation, and it does not need to have a high positional accuracy wherein a geometric center of the mounting table 38A coincides with that of the dummy substrate DW precisely. At this time, depending on the fixed set of delivery position coordinates, the dummy substrate DW may be mounted somewhat misaligned on the mounting table 38A. However, the mounting table 38A is a mere relay place for transferring the wafer to the susceptors 12A~12D of the processing devices 4A~4D, which correspond to a final destination. Therefore, as long as the dummy substrate DW can be supported at a proper position at a final destination (a susceptor of each processing device), it does not matter that the dummy substrate DW is misaligned somewhat from the geometric center of the mounting table 38A. Further, if the set of delivery position coordinates, which has been temporarily determined at the first process, has an accuracy within a tolerance range, this temporarily determined set of delivery position coordinates may be used as a fixed set of delivery position coordinates without being changed. Such a criteria may be applied in the same manner in determining a set of delivery position coordinates of the pick for the mounting table 38B.

In the following, the dummy substrate DW is supported at a proper position of the other pick B1 (by a position alignment by the manual operation of the operator by using the mark of the dummy substrate DW); transferred to the mounting table 38B of the second load-lock chamber 8B by a moving operation as indicated by an arrow X2 of FIG. 2A, which is accompanied by a manual control; and mounted on a substantially central position of the mounting table 38B (the delivery position alignment may be performed without mounting it practically). Further, a set of delivery position coordinates corresponding to a mounting position is fixed as a final set of delivery position coordinates. Accordingly, the set of delivery position coordinates of the pick B1 for the mounting table 38B of the second load-lock chamber 8B is fixed.

In the following, the dummy substrate DW supported at the proper position on the pick B1 is elevated from the mounting table 38B in an automated manner by using the pick B1 (or the dummy substrate DW is continuously supported on the pick B1 in case where the dummy substrate DW is not really mounted on the mounting table at the prior process), to thereby be transferred to the mounting table 38A of the first load-lock chamber 8A by a moving operation as indicated by the arrow X1 of FIG. 2A, which is accompanied by a manual control, and thus, being mounted on a substantially central position of the mounting table 38A. Further, a set of delivery position coordinates corresponding to a mounting position is fixed as a final set of delivery position coordinates. Accordingly, a set of delivery position coordinates of the pick B1 for the mounting table 38A of the first load-lock chamber 8A is fixed. It is sufficient that the sets of delivery position coordinates fixed herein of the pick B1 for the respective mounting tables 38A and 38B of the load-lock chambers 8A and 8B have a positional accuracy to such a degree that it will not affect a transfer operation, same as the case for the set of delivery position coordinates 8A of the pick B2 for the mounting table 38A of the first load-lock chamber.

Further, a fixing sequence of sets of the delivery position coordinates between the respective picks B1 and B2 and the respective load-lock chambers 8A and 8B is not limited to the aforementioned sequence, and any sequences may be employed. However, in the embodiment illustrated herein, the set of delivery position coordinates of the pick B1 for the mounting table 38A of the first load-lock chamber 8A is finally determined, in order to smoothly move to a following fourth process.

In the following is described a fourth process. At the fourth process, the dummy substrate DW inside the first load-lock chamber 8A is transferred to the orienter 26 in an automated manner to be mounted thereon (S4). Specifically, the dummy substrate DW, which has been mounted on the substantially central position of the mounting table 38A of the first load-lock chamber 8A by using the pick B1 at the third process, is unloaded by using one pick of the first transfer mechanism 22, e.g., the pick A2, as described in FIG. 3A; and transferred to the orienter 26 along a transfer route described in an arrow X3, to be transported thereon. Here, it is advised that the transfer route indicated by the arrow X3 includes one access point (i.e., an access point of the pick A2 to the mounting table 38A of the first load-lock chamber 8A), where the set of delivery position coordinates is not fixed (i.e., it remains undetermined at the first process).

In the following will be described a fifth process. At the fifth process, an amount of positional displacement of the dummy substrate DW, which has been transported on the orienter 26 at the fourth process, is calculated; the set of delivery position coordinates of the access point of the pick A2 to the mounting table 38A of the first load-lock chamber 8A, has been temporarily determined at the first process, is corrected based on the calculated amount of positional displacement to compensate for it; and the corrected set of delivery position coordinates is fixed as a final set of delivery position coordinates (S5). In the tables shown in FIGS. 3B, 4B~7B, the term "corrected" indicates a state where the set of delivery position coordinates, that has been temporarily determined at the first process, is fixed after being corrected.

In the following will be described a sixth process. At the sixth process, as described in FIG. 4A, the dummy substrate DW, which has been mounted on the orienter 26 at the fourth process, is elevated by using the pick A2; and the elevated dummy substrate DW is transferred to the mounting table 38A inside the first load-lock chamber 8A in an automated manner along a transfer route indicated by an arrow X4 to be automatically mounted thereon. Further, when the dummy substrate DW is elevated from the orienter 26 by using the pick A2, it is allowed to be supported at a proper position on the pick A2. It can be realized in such a manner that a rotation position of the rotatable table 28 of the orienter 26 returns to the same position where the dummy substrate DW was mounted on the orienter 26 at the fourth process, and at the same time, the set of delivery position coordinates of the access point of the pick A2 to the orienter 26 is temporarily shifted by an amount corresponding to a correction amount of set of delivery position coordinates of the access point of the pick A2 to the mounting table 38A of the first load-lock chamber 8A at the fifth process. A process for temporarily shifting the set of delivery position coordinates, as mentioned above, is performed by the controller 40. (Hereinafter, in the present specification, elevating the dummy substrate as mentioned above is referred to as an "elevation accompanied by a positional displacement correction".). As described above, the dummy substrate DW is mounted on the mounting table 38A at the same position as where it was mounted at the third process. Next, the pick A1 approaches for the dummy substrate DW to the mounting table 38A in an automated manner; and the dummy substrate DW is transferred to the orienter 26 in an automated manner along a transfer route indicated by an arrow X5 to be transported thereon (S6). Here, it is advised that the transfer routes indicated by the arrows X4 and X5 have one access point (i.e., an access point of the pick A1 to the mounting table 38A of the first load-lock chamber 8A), where the set of delivery position coordinates thereof remains unfixed during the transportations along the respective routes (i.e., it remains undetermined at the first process).

In the following will be described a seventh process. At the seventh process, an amount of positional displacement of the dummy substrate DW, which has been transported on the orienter 26 at the sixth process, is calculated; the set of delivery position coordinates of the access point of the pick A1 to the mounting table 38A of the first load-lock chamber 8A, that has been temporarily determined at the first process, is corrected based on the calculated amount of positional displacement to compensate for it; and the corrected set of delivery position coordinates is fixed as a final set of delivery position coordinates (S7).

Further, at the sixth process, it may be configured such that the pick A1 is employed for the transportation along the transfer route indicated by the arrow X4 and the pick A2 is employed for the transportation along the transfer route indicated by the arrow X5, respectively.

By the aforementioned processes, in case of using the pick either A1 or A2, the dummy substrate DW on the orienter 26 is automatically transferred to the mounting table 38A of the first load-lock chamber 8A by the pick either A1 or A2, so that it can be mounted at the same position as where it was mounted on the mounting table 38A at the prior third process.

In the following will be described an eighth process. At the eighth process, as described in FIG. 5A, the dummy substrate DW mounted on the orienter 26 at the sixth process is elevated by using the pick (either A1 or A2); and the elevated dummy substrate DW is transferred to the mounting table 38A inside the first load-lock chamber 8A in an automated manner along a transfer route indicated by an arrow X6 to be automatically mounted thereon. Further, when the dummy substrate DW is elevated from the orienter 26 by using the pick either A1 or A2, it is allowed to be supported at a proper position on the pick. For this, "the elevation accompanied by a positional displacement correction", that was carried out at the sixth process, is performed. Subsequently, the pick B1 of the second transfer mechanism 14 approaches for picking up the dummy substrate DW to the mounting table 38A in an automated manner; and the elevated dummy substrate DW is transferred to the mounting table 38B of the second load-lock chamber 8B along a transfer route indicated by an arrow X7 to be automatically transported thereon (S8).

In the following will be described a ninth process. At the ninth process, as described in FIG. 5A, the pick A2 of the first transfer mechanism 22 automatically approaches for the dummy substrate DW, which has been mounted on the mounting table 38B at the eighth process; and the elevated dummy substrate DW is transferred to the orienter 26 in an automated manner along a transfer route indicated by an arrow X8 to be automatically transported thereon (S9). Here, it is advised that the transfer routes indicated by the arrows X6, X7 and X8 include one access point (i.e., an access point of the pick A2 to the mounting table 38B of the second load-lock chamber 8B), where the set of delivery position coordinates thereof remains unfixed (i.e., it remains undetermined at the first process).

In the following will be described a tenth process. At the tenth process, as described in FIG. 5B, an amount of positional displacement of the dummy substrate DW, which has been mounted on the orienter 26 at the ninth process, is calculated; the set of delivery position coordinates of the access point of the pick A2 to the mounting table 38B of the second load-lock chamber 8B, that has been temporarily determined at the first process, is corrected based on the calculated amount of positional displacement to compensate for it; and the corrected set of delivery position coordinates is fixed as a final set of delivery position coordinates (S10).

In the following will be described an eleventh process. At the eleventh process, as described in FIG. 6A, the dummy substrate DW mounted on the orienter 26 at the ninth process is elevated by using the pick A2; and the elevated dummy substrate DW is transferred to the mounting table 38B inside the second load-lock chamber 8B in an automated manner along a transfer route indicated by an arrow X9 to be mounted thereon. When the dummy substrate DW is elevated from the orienter 26 by using the pick A2, it is allowed to be supported at a proper position on the pick A2. For this, "the elevation accompanied by a positional displacement correction", that was carried out at the sixth process, is performed. Accordingly, the dummy substrate DW comes to be exactly mounted at a fixed position on the mounting table 38B as described in FIG. 5A. Subsequently, the pick A1 automatically approaches for the dummy substrate DW on the mounting table 38A to pick up same; and the elevated dummy substrate DW is transferred to the orienter 26 in an automated manner along a transfer route indicated by an arrow X10 to be automatically transported thereon (S11). Here, it is advised that the transfer routes indicated by the arrows X9 and X10 include one access point (i.e., an access point of the pick A1 to the mounting table 38B of the second load-lock chamber 8B), where the set of delivery position coordinates thereof remains unfixed (i.e., it remains undetermined at the first process).

In the following will be a twelfth process. At the twelfth process, an amount of positional displacement of the dummy substrate DW, which has been mounted on the orienter 26 at the tenth process, is calculated; the set of delivery position coordinates of the access point of the pick A1 to the mounting table 38B of the second load-lock chamber 8B, that has been temporarily determined at the first process, is corrected based on the calculated amount of positional displacement to compensate for it; and the corrected set of delivery position coordinates is fixed as a final set of delivery position coordinates (S12).

Further, at the eleventh process, it may be configured such that the pick A1 is employed for the transportation along the transfer route indicated by the arrow X9 and the pick A2 is employed for the transportation along the transfer route indicated by the arrow X10, respectively.

By the aforementioned processes, in case of using the pick either A1 or A2, the dummy substrate DW on the orienter 26 is automatically transported to the mounting table 38B of the second load-lock chamber 8B by using the pick either A1 or A2, so that it can be mounted at the same position as where it was mounted the mounting table 38B at the prior third process.

In the following will be a thirteenth process. At the thirteenth process, as described in FIG. 7A, the dummy substrate DW mounted on the orienter 26 at the eleventh process is elevated by using the pick (A1 or A2); and the elevated dummy substrate DW is transferred to the mounting table 38A inside the first load-lock chamber 8A in an automated manner along a transfer route indicated by an arrow X11 to be mounted thereon. Further, when the dummy substrate DW is elevated from the orienter 26 by using the pick either A1 or A2, it is allowed to be supported at a proper position on the pick. For this, "the elevation accompanied by a positional displacement correction", that was carried out at the sixth process, is performed. Subsequently, the pick B2 of the second transfer mechanism 14 automatically approaches for the dummy substrate DW mounted on the mounting table 38A to pick up same; and the dummy substrate DW is transferred to the mounting table 38B of the second load-lock chamber 8B along a transfer route indicated by an arrow X12 to be automatically transported thereon (S13).

In the following will be described a fourteenth process. At the fourteenth process, as described in FIG. 7A, the pick either A1 or A2 of the first transfer mechanism 22 automatically approaches for the dummy substrate DW mounted on the mounting table 38B at the thirteenth process; and the elevated dummy substrate DW is transferred to the orienter 26 in an automated manner along a transfer route indicated by an arrow X13 to be automatically transported thereon (S14).

Here, it is advised that the transfer routes indicated by the arrows X11, X12 and X13 include one access point (i.e., an access point of the pick B2 to the mounting table 38B of the second load-lock chamber 8B), where the set of delivery position coordinates thereof remains unfixed (i.e., it remains undetermined at the first process).

In the following will be described a fifteenth process. At the fifteenth process, an amount of positional displacement of the dummy substrate DW, which was transported on the orienter 26 at the fourteenth process, is calculated; the set of delivery position coordinates of the access point of the pick B2 to the mounting table 38B of the second load-lock chamber 8B, that has been temporarily determined at the first process, is corrected based on the calculated amount of positional displacement to compensate for it; and the corrected set of delivery position coordinates is fixed as a final set of delivery position coordinates (S15).

By the aforementioned respective processes, as described in FIG. 7B, the set of delivery position coordinates for all access points of the respective picks A1, A2, B1 and B2 to the mounting tables 38A and 38B of the first and the second load-lock chamber 8A and 8B are fixed. As a result, in case where the dummy substrate DW on the orienter 26 is transferred to the picks B1 and B2, it can be transferred while being kept at the same positions on the respective picks B1 and B2, by using any transfer routes, i.e., any one of the picks A1 and A2, and passing any one of the first and the second load-lock chamber 8A and 8B.

In the following will be described a sixteenth process. At the sixteenth process, as described in FIG. 8, the dummy substrate DW mounted on the orienter 26 at the fourteenth process is unloaded; and the unloaded dummy substrate DW is transferred to the susceptor 12A inside the processing device 4A in an automated manner along a transfer route indicated by an arrow 20 of FIG. 8 to be transported thereon (S16). At this time, the dummy substrate DW is transported by using any one of the picks B1 and B2 of the second transfer mechanism 14, e.g., the pick B1 in the present embodiment. Further, any transfer routes of the dummy substrate DW from the orienter 26 to the pick B1, i.e., any picks of the first transfer mechanism 22 and any load-lock chambers to be passed, may be adopted. Further, when the dummy substrate DW mounted on the orienter 26 is elevated by using the first transfer mechanism 22 (pick A1 or A2), it is allowed to be supported at a proper position on the pick. For this, "the elevation accompanied by a positional displacement correction", that was carried out at the sixth process, is performed.

In the following will be described a seventeenth process. At the seventeenth process, as described in FIG. 8, the other pick B2 automatically approaches for the dummy substrate DW on the susceptor 12A to pick up same; and the unloaded dummy substrate DW, which was automatically unloaded, is transferred to the orienter 26 in an automated manner along a transfer route indicated by an arrow X21 to be automatically transported thereon (S17).

In the following will be described an eighteenth process. At the eighteenth process, an amount of positional displacement of the dummy substrate DW, which was transported to the orienter 26 at the seventeenth process, is calculated; the set of delivery position coordinates of the access point of the pick B2 to the susceptor 12A, that has been temporarily determined at the first process, is corrected based on the calculated amount of positional displacement to compensate for it; and the corrected set of delivery position coordinates is fixed as a final set of delivery position coordinates (S18). In this case, the temporarily determined set of delivery position coordinates of the access point of the other pick B1 to the susceptor 12A is fixed as it is without being changed.

In the following will be described a nineteenth process. At the nineteenth process, the respective processes of the aforementioned steps S16~S18 are performed on the other processing devices 4B~4D in the same manner, and thus, sets of delivery position coordinates of the picks B1 and B2 for the respective susceptors 12B~12D may be fixed (S19). Therefore, the dummy substrates DW, i.e., the semiconductor wafers, on the respective susceptors 12A~12D may be reproducibly mounted exactly at the same position in an automated manner. Accordingly, in case where the wafer unloaded from the cassette container 20 is mounted on each of the susceptors 12A~12D in a real process, it can be reproducibly mounted at the same position on each of the susceptors 12A~12D through any transfer routes.

In accordance with the aforementioned embodiment, the fourth to nineteenth processes are performed in an automated manner without requiring any manual handling (i.e., without performing a mounting of the dummy substrate DW by a manual operation or performing a manual movement of the pick), so that the teaching operation can be carried out rapidly and exactly. In the aforementioned embodiment, an example of performing the sixteenth to nineteenth processes after the completion of the fifteenth process has been explained. However, the sixteenth to nineteenth processes may be performed even though the fifteenth process is not completed, as long as the sets of delivery position coordinates of two picks of the second transfer mechanism for at least one of the first and the second load-lock chamber 8A and 8B and the set of delivery position coordinates of at least one pick of the first transfer mechanism for the corresponding load-lock chamber are fixed.

Further, in the delivery position aligning method for the aforementioned processing device, the center of each of the susceptors 12A~12D does not always coincide with that of the dummy substrate DW. In a real processing device, e.g., a plasma processing device, the geometric center of the susceptor does not necessarily coincide with that of the reaction. For the same reason, in case where a specified processing device is employed or a specified process condition is adopted in the processing device, an in-surface uniformity in a wafer processing is confirmed for each semiconductor wafer, whenever performing processings on plural semiconductor wafers; and a mounting position of the wafer on the susceptor is properly adjusted such that the center thereof coincides with that of the reaction based on the result. In this case, the center of the wafer is not required to coincide with that of the susceptor when mounted, but required to be mounted reproducibly at the same position on the susceptor.

In the following, a delivery position aligning method for making the centers of the respective susceptors 12A~12D of the processing devices 4A~4D coincide with the central position of the dummy substrate DW will be discussed. In this delivery position aligning method, the sixteenth to nineteenth processes among the aforementioned first through nineteenth processes are replaced by following processes.

First, after the fifteenth process is completed, the dummy substrate DW is mounted on the susceptor 12A of one processing device, e.g., the processing device 4A, by the manual operation of the operator such that the center thereof coincides with that of the susceptor.

In the following, the dummy substrate DW on the susceptor 12A is unloaded in an automated manner by using one pick, e.g., the pick B1; and further, automatically transferred to the orienter 26 to be transported thereon. During the transportation, any load-lock chambers may be passed, and any picks of the first transfer mechanism 22 may be used. Subsequently, an amount of positional displacement of the dummy substrate DW mounted on the orienter 26 is calculated; the set of delivery position coordinates of the access point of the pick B1 to the susceptor 12A of the processing device 4A, that has been temporarily determined at the first process, is corrected based on the amount of positional displacement; and the corrected set of delivery position coordinates is fixed as a final set of delivery position coordinates.

In the following, the dummy substrate DW mounted on the orienter 26 is elevated; and the elevated dummy substrate DW is transferred to the pick B1 in an automated manner to be automatically mounted on the susceptor 12A of the processing device 4A by using the pick B1. During the transportation, any load-lock chambers may be passed, and any picks of the first transfer mechanism 22 may be used. Further, when the dummy substrate DW mounted on the orienter 26 is unloaded by using the first transfer mechanism 22 (pick A1 or A2), it is allowed to be supported at a proper position on the pick. For this, "the elevation accompanied by a positional displacement correction", that was carried out at the sixth process, is performed. At this time, since the set of delivery position coordinates of the access point of the pick B1 to the susceptor 12A has been fixed with high accuracy, the dummy substrate DW comes to be mounted on the susceptor 12A such that the center thereof coincides with that of the susceptor 12A.

In the following, the dummy substrate DW mounted on the susceptor 12A is unloaded by using the other pick B2 in an automated manner; and further, transferred in an automated manner to the orienter 26 to be automatically transported thereon. During the transportation, the transportation route may go through any load-lock chambers, and any picks of the first transfer mechanism 22 may be used. Subsequently, an amount of positional displacement of the dummy substrate DW mounted on the orienter 26 is calculated; the set of delivery position coordinates of the access point of the pick B2 to the susceptor 12A of the processing device 4A, that has been temporarily determined at the first process, is corrected based on the amount of positional displacement, and the corrected set of delivery position coordinates is fixed as a final set of delivery position coordinates.

In the following, the respective processes performed on the processing device 4A so far are performed on the other processing devices 4B~4D in the same manner, and thus, the sets of delivery position coordinates of the access points of the picks B1 and B2 to the respective susceptors 12B~12D can be fixed with high accuracy. Accordingly, the dummy substrate DW, i.e., the semiconductor wafer, can be exactly mounted in an automated manner at proper positions on the respective susceptors 12A~12D.

In the following, a delivery position aligning method for the respective inlet ports 18A~18C of both picks A1 and A2 of the first transfer mechanism 22 will be discussed. First, the transparent cassette container 20 is provided; the dummy substrate DW is manually position-aligned at one portion, e.g., a lowest portion, of the cassette container 20 (see FIG. 1) by the operator, to thereby be accommodated therein at a proper position; and the cassette container 20 is manually position-aligned at a proper position on one inlet port, e.g., the inlet port 18A, by the operator, to thereby be mounted thereon. Further, one pick, e.g., the pick A1, is manually operated to keep the dummy substrate DW inside the cassette container 20 at a proper position; and, at this time, a set of coordinates of the pick A1 is fixed as a set of delivery position coordinates. Still further, such an operation is performed on the other pick A2, in the same manner. Still further, position aligning operations of the picks A1 and A2 as mentioned above are performed on the other inlet ports 18B and 18C in the same manner. Still further, during the teaching, a delivery position alignment for any one inlet port may be performed only on any one slot of the cassette container 20. When a substrate to be processed is transferred in a real operation of the processing device, a receiving state of the substrate inside the cassette container 20 is detected by a so-called 'mapping', that has been commonly known, and a set of delivery position coordinates of the height and direction for the substrate in each of the slots of the cassette container 20 is determined for each time, based on the mapping result.

In the following, a second embodiment will now be discussed. The second embodiment may be applied for the same processing system as in the aforementioned first embodiment, but it is different form the first embodiment in a fixing sequence of each set of delivery position coordinates (Comparing FIG. 7B with FIG. 11A).

In the second embodiment, the first and the second process of the first embodiment are also performed in the same manner. In the second embodiment, the third process of the first embodiment is replaced with a following process A1. In the process A1, fixing a set of delivery position coordinates of the pick A1 for the second load-lock chamber 8B is carried out. The process A1 is performed in such a manner that the dummy substrate DW is mounted on the temporarily determined set of delivery position coordinates for the mounting table 38B, and transferred to the orienter 26; an amount of positional displacement of the dummy substrate DW is calculated; and the temporarily determined set of delivery position coordinates is corrected based on the amount of positional displacement.

The respective processes of the teaching in the second embodiment are the same as the corresponding processes performed in the first embodiment to the same purpose. Hereinafter, processes A2~A6 of FIG. 11A will be discussed simply.

First, sets of delivery position coordinates of the pick A1 and A2 for the first load-lock chamber are fixed in the same manner as in the fourth to seventh processes of the first embodiment (processes A2 and A3). Then, the dummy substrate DW on the orienter 26 is transferred to the second load-lock chamber 8B by using the pick A1, and subsequently, transported on the orienter 26 by using the pick A2 to calculate an amount of positional displacement thereof; and, the set of delivery position coordinates of the pick A2 for the second load-lock chamber 8B is fixed based on the calculated amount of positional displacement (process A4). Thereafter, the dummy substrate DW on the orienter 26 is transferred to the first load-lock chamber 8A by using the pick A1, subsequently, transported on the second load-lock chamber 8B by using the pick B1, and then, transported on the orienter 26 by using the pick A1 to calculate an amount of positional displacement thereof; and the set of delivery position coordinates of the pick B1 for the second load-lock chamber 8B is fixed based on the calculated amount of positional displacement (process A5). The set of delivery position coordinates of the pick B2 for the second load-lock chamber 8B is fixed in the same manner (process A6).

In the following, a third embodiment will be explained with reference to FIG. 11B. A delivery position determining method in accordance with the third embodiment is different from the first embodiment in that it is for a processing system whose first transfer mechanism 22 has only one pick. The respective processes of the teaching in the third embodiment are the same as the corresponding processes performed in the first and the second embodiment to the same purpose, and explanations thereof will be made simple.

First, in the same manner as in the first and the second embodiment, sets of delivery position coordinates of the respective picks for the respective load-lock chambers are temporarily determined or fixed. When this process is completed, the dummy substrate DW is mounted on the mounting table 38B inside the second load-lock chamber 8B (process B1).

Next, the dummy substrate DW is transported on the orienter 26 by using the pick A1; an amount of positional displacement of the dummy substrate DW is calculated; and the set of delivery position coordinates of the pick A1 for the second load-lock chamber 8B is fixed based on the calculated amount of positional displacement (process B2).

Thereafter, the dummy substrate DW is transported on the first load-lock chamber 8A by using the pick A1, transported therefrom to the second load-lock chamber 8B by using the pick B1, and subsequently, transported to the orienter 26 by using the pick A1 to calculate an amount of positional displacement thereof; and the set of delivery position coordinates of the pick B1 for the first load-lock chamber 8A is fixed based on the amount of positional displacement (process B3).

The set of delivery position coordinates of the pick B2 for the first load-lock chamber 8A is fixed in the same manner (process B4).

In the following, a fourth embodiment will now be discussed with reference to FIG. 11C. A delivery position determining method in accordance with the fourth embodiment is different from the first embodiment in that it is for a processing system whose second transfer mechanism 14 has only one pick B1. The respective processes of the teaching in the fourth embodiment are the same as the corresponding processes performed in the first and the second embodiment to the same purpose, and explanations thereof will be made simple.

First, in the same manner as in the first and the second embodiment, sets of delivery position coordinates of the respective picks for the respective load-lock chambers are temporarily determined or fixed. When this process is completed, the dummy substrate DW is mounted on the mounting table 38A inside the first load-lock chamber 8A (process C1).

Next, the set of delivery position coordinates of the picks A1 and A2 for the first load-lock chamber are fixed in the same manner as in the fourth through seventh processes in the first embodiment (processes C2 and C3).

Thereafter, the dummy substrate DW on the orienter 26 is transferred to the first load-lock chamber 8A by using the pick A1, transferred therefrom to the second load-lock chamber 8B by using the pick B1, and subsequently, transported on the orienter 26 by using the pick A1 to calculate an amount of positional displacement thereof; and the set of delivery position coordinates of the pick B1 for the second load-lock chamber 8B is fixed based on the amount of positional displacement (process C4).

After that, the dummy substrate DW is transferred to the second load-lock chamber 8B by using the pick A1, and subsequently, transported on the orienter 26 by using the pick A2 to calculate an amount of positional displacement thereof; and the set of delivery position coordinates of the pick A2 for the second load-lock chamber 8B is fixed based on the calculated amount of positional displacement (process C5).

In the following, a fifth embodiment will now be discussed with reference to FIG. 11D. A delivery position determining method in accordance with the fifth embodiment is different from the first embodiment in that it is for a processing system whose first and second transfer mechanisms 22 and 14 have only one pick A1 and B1, respectively. The respective processes of the teaching in the fifth embodiment are the same as in the processes performed in the first and the second embodiment to the same purpose, and explanations thereof will be made simple.

First, in the same manner as in the first and the second embodiment, sets of delivery position coordinates of the picks for the respective load-lock chambers are temporarily determined or fixed. When this process is completed, the dummy substrate DW is mounted on the temporarily determined set of delivery position coordinates of the pick B1 for the mounting table 38A inside the first load-lock chamber 8A (process D1).

Next, the dummy substrate DW is transported on the orienter 26 by using the pick A1 to calculate an amount of positional displacement thereof; and the set of delivery position coordinates of the pick B1 for the first load-lock chamber 8A is fixed based on the amount of positional displacement (process D2).

Thereafter, the dummy substrate DW is transferred to the first load-lock chamber 8A by using the pick A1, transferred therefrom to the second load-lock chamber 8B by using the pick B1, and subsequently, transported on the orienter 26 by using the pick A1 to calculate an amount of positional displacement thereof; and the set of delivery position coordinates of the pick B1 for the second load-lock chamber 8B is fixed based on the calculated amount of positional displacement (process D3).

In the following, a sixth embodiment will be discussed. A configuration of a processing system corresponding to an object of a delivery position determining method in accordance with the following sixth embodiment will be simply explained by describing a difference from that of the processing system corresponding to the object of the delivery position determining method in accordance with the first embodiment. In the processing system shown in FIG. 12, to the common transfer chamber 6, there is connected another approximately hexagonal shaped common transfer chamber 52 through a buffer mounting table 50 capable of mounting thereon a semiconductor wafer. Two processing devices 4A and 4D are connected to the front common transfer chamber 6, and four processing devices 4E, 4F, 4G and 4H are connected to the rear common transfer chamber 52. Further, susceptors 12E~12H are installed in the respective processing devices 4E~4H. Still further, a third transfer mechanism 54 having the same configuration with the second transfer mechanism 14 is installed inside the rear common transfer chamber 52. The third transfer mechanism 54 has two picks C1 and C2. Transfer of the wafer is performed between the front and the rear common transfer chamber 6 and 52 through the buffer mounting table 50.

Figure 12:
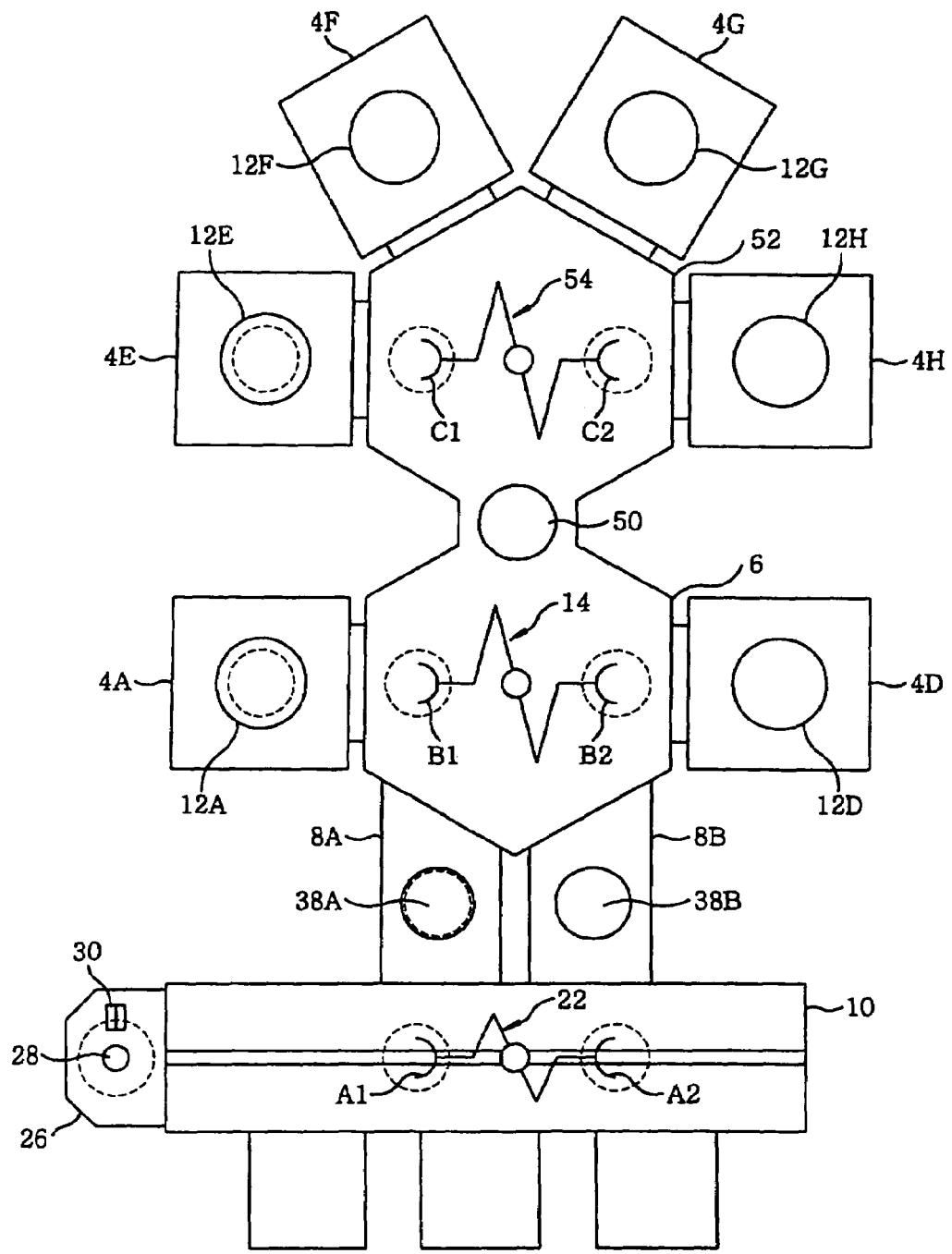
FIG. 12 describes a schematic configuration view showing a modified example of a processing system capable of employing the delivery position aligning method in accordance with the present invention.

In case where a delivery position alignment is carried out in the processing system as described in FIG. 12, determining a set of delivery position coordinates for the first transfer mechanism 22, and fixing sets of delivery position coordinates of the second transfer mechanism 14 for the first and the second load-lock chamber 8A and 8B and the processing devices 4A and 4D are carried out by following the same processes as in the first embodiment. Further, fixing a set of delivery position coordinates of the second transfer mechanism 14 for the buffer mounting table 50 is performed by following the same processes as for the processing devices 4A and 4D, as well.

Hereinafter, a fixing sequence of the sets of delivery position coordinates of the picks C1 and C2 of the third transfer mechanism 54 for the buffer mounting table 50 will now be explained.

First, a dummy substrate DW is kept on the picks C1 and C2 while it being properly position-aligned manually by the operator; it is mounted at a proper position on the buffer mounting table 50 by manually operating the pick; and thus, respective sets of delivery position coordinates are fixed.

Subsequently, the dummy substrate DW is automatically transferred from the orienter 26 to one pick, e.g., the pick C1; and automatically loaded into the processing device 4E by using the pick C1 to be transported on the susceptor 12E in an automated manner. Thereafter, the dummy substrate DW is automatically unloaded by using the other pick C2; and automatically transferred to the orienter 26 to calculate an amount of positional displacement of the dummy substrate DW for the orienter 26. Further, the temporarily determined set(s) of delivery position coordinates(s) of any one or both picks C1 and C2 are corrected to be fixed, in order to compensate for the amount of positional displacement. Still further, such an operation is performed on the other processing devices 4F~4H. Accordingly, the sets of delivery position coordinates of the picks C1 and C2 for the respective processing devices 4E~4H are fixed.

The present invention is not limited to the aforementioned embodiments. For example, the number of load-lock chambers of the transfer system (processing system) is not limited to two, and three or more may be applied for a delivery position determining method in accordance with the present invention. Further, an object to be transferred (an object to be processed) is not limited to a semiconductor wafer, and a glass substrate or an LCD substrate may be used.

While the invention has been shown and described with respect to the preferred embodiments, it will be understood by those skilled in the art that various changes and modifications may be made without departing from the spirit and scope of the invention as defined in the following claims.

What is claimed is:

1. A delivery position aligning method for use in a transfer system, wherein the transfer system is provided with:
    a first transfer mechanism having at least one pick for supporting an object to be transferred;
    a second transfer mechanism having at least one pick for supporting the object;
    plural devices which can be accessed by at least one of the first and the second transfer mechanism, wherein the object is transferred between the devices and a pick of a transfer mechanism gaining access thereto;
    a position aligning device as one of the plural devices, wherein the position aligning device can be accessed by the first transfer mechanism and detects an amount of positional displacement of a central position of the object mounted thereon;
    a first relay unit as one of the plural devices, wherein the first relay unit can be accessed by the first and the second transfer mechanism and temporarily supports the object while being transferred between the first and the second transfer mechanism; and
    a second relay unit as one of the plural devices, wherein the second relay unit can be accessed by the first and the second transfer mechanism and temporarily supports the object while being transferred between the first and the second transfer mechanism,
    the method comprising:
    a temporarily determining step of temporarily determining with a rough accuracy a set of delivery position coordinates that defines an access point of each pick of each transfer mechanism to each of the plural devices;
    a first fixing step of fixing a set of delivery position coordinates of each pick of the first transfer mechanism for the position aligning device;
    a second fixing step of fixing parts of sets of delivery position coordinates of each pick of each transfer mechanism for devices other than the position aligning device;
    a third fixing step of transferring a position alignment object to the position aligning device via a transfer route passing an unfixed set of delivery position coordinates that has been temporarily determined at the temporarily determining step; calculating an amount of positional displacement of the position alignment object that is supported by the position aligning device; correcting the unfixed set of delivery position coordinates based on the amount of positional displacement of the position alignment object; and fixing the corrected set of delivery position coordinates as a fixed set of delivery position coordinates; and
    a fourth fixing step of repeatedly performing the third fixing step until all unfixed sets of delivery position coordinates, which have been temporarily determined at the temporarily determining step, are fixed.

2. The delivery position aligning method of claim 1, wherein the transfer route passing the temporarily determined and an unfixed set of delivery position coordinates includes:
    a route for transferring the position alignment object from the position aligning device to the first relay unit by using any one pick of the first transfer mechanism;
    a route for transferring the position alignment object from the first relay unit to the second relay unit by using any one pick of the second transfer mechanism; and
    a route for transferring the position alignment object from the second relay unit to the position aligning device by using any one pick of the first transfer mechanism.

3. The delivery position aligning method of claim 1, wherein, in the transfer route passing the temporarily determined and unfixed set of delivery position coordinates, only one set of delivery position coordinates among plural sets of delivery position coordinates contained in the transfer route is unfixed and the remaining sets are fixed when attempting to transfer the position alignment object along the transfer route.

4. The delivery position aligning method of claim 1, wherein the plural devices include a processing device for processing an object transferred thereto, the processing device being disposed at a position to which the second transfer mechanism is accessible, and the second transfer mechanism has a first and a second pick, and
    wherein the delivery position aligning method further comprises the steps of:
    after fixing sets of delivery position coordinates of the two picks of the second transfer mechanism for at least one of the first and the second relay unit and a set of delivery position coordinates of at least one pick of the first transfer mechanism for said at least one of the first and the second relay unit, transferring the position alignment object to the processing device by using the first pick of the second transfer mechanism based on a temporarily determined set of delivery position coordinates of the first pick of the second transfer mechanism for the processing device;
    unloading from the processing device the position alignment object transferred thereto by using the second pick of the second transfer mechanism based on a temporarily determined set of delivery position coordinates of the second pick for the processing device and, further, transferring same to the position aligning device;

obtaining an amount of positional displacement of the position alignment object by using the position aligning device, and correcting the set(s) of delivery position coordinates of any one or both pick(s) of the second transfer mechanism for the processing device based on the obtained amount of positional displacement; and fixing the corrected sets of delivery position coordinates as fixed sets of delivery position coordinates of both picks, in case where the sets of delivery position coordinates of both picks of the second transfer mechanism for the processing device are corrected, or fixing the corrected set of delivery position coordinates of one pick and the temporarily determined set of delivery position coordinates of the other pick as fixed sets of delivery position coordinates of both picks, in case where the set of delivery position coordinates of only said one pick of the second transfer mechanism for the processing device is corrected.

5. The delivery position aligning method of claim 4, wherein the transfer system is further provided with a receiving member for receiving the object and disposed at a position to which the first transfer mechanism is accessible, and wherein the delivery position aligning method further comprises the step of fixing a set of delivery position coordinates of each pick of the first transfer mechanism for the position alignment object accommodated in the receiving member.

6. A delivery position aligning method for use in a transfer system, wherein the transfer system is provided with:

a position aligning device for detecting an amount of positional displacement of a central position of an object mounted thereon;

a mounting device for mounting thereon the object while the object is transferred; and a transfer mechanism having two picks supporting the object, the method comprising the steps of:

temporarily determining with a rough accuracy sets of delivery position coordinates that define access points of each pick of the transfer mechanisms to the position aligning device and the mounting device;

fixing a set of delivery position coordinates of each pick of the transfer mechanism for the position aligning device;

mounting a position alignment object on a normal position of the mounting device, and transferring the mounted position alignment object to the position aligning device by using a first pick of the transfer mechanism;

obtaining an amount of positional displacement of the position alignment object by using the position aligning device, correcting a set of delivery position coordinates of the first pick of the transfer mechanism for the mounting device based on the amount of positional displacement, and fixing the corrected set of delivery position coordinates as a fixed set of delivery position coordinates;

transferring the position alignment object mounted on the position aligning device to the mounting device by using one pick of the transfer mechanism;

transferring the position alignment object to the position aligning device by using the other pick of the transfer mechanism; and obtaining an amount of positional displacement of the position alignment object by using the position aligning device, correcting a set of delivery position coordinates of the second pick of the transfer mechanism for the mounting device based on the amount of positional displacement, and fixing the corrected set of delivery position coordinates as a fixed set of delivery position coordinates.

7. The delivery position aligning method of claim 6, wherein the steps of fixing the sets of delivery position coordinates of the first and the second pick are performed by correcting a temporarily determined set of delivery position coordinates of each pick for the mounting device to compensate for a corresponding amount of positional displacement.

8. An object processing system in which an object delivery position aligning process is carried out by the method recited in any one of claims 1 to 7.

* * * * *